United States Patent
Fredrickson et al.

(10) Patent No.: US 6,400,288 B1
(45) Date of Patent: Jun. 4, 2002

(54) METHOD AND APPARATUS FOR GENERATING CODE WORDS WITH SHIFTED TRIBIT ERROR PROTECTION

(75) Inventors: Lisa Fredrickson, Seattle, WA (US); Anuradha Sukhija, Northridge, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/397,935

(22) Filed: Sep. 17, 1999

(Under 37 CFR 1.47)

Related U.S. Application Data

(60) Provisional application No. 60/101,323, filed on Sep. 22, 1998.

(51) Int. Cl.[7] .................................................. H03M 7/00
(52) U.S. Cl. .............................. 341/59; 341/50; 341/58; 341/63; 341/67; 341/68; 341/71; 341/72; 360/40; 375/260; 375/261; 375/265; 375/251
(58) Field of Search ............................. 341/59, 58, 50, 341/63, 67, 68, 71, 72; 340/347; 360/40; 375/260, 261, 265, 251

(56) References Cited

U.S. PATENT DOCUMENTS

| | | | |
|---|---|---|---|
| 5,257,272 A | | 10/1993 | Frederickson ................. 371/43 |
| 5,280,489 A | | 1/1994 | Frederickson et al. ........ 371/45 |
| 5,933,103 A | * | 8/1999 | Kim ............................... 341/59 |
| 6,175,318 B1 | * | 1/2000 | Kahhman et al. .............. 341/59 |
| 6,046,691 A | * | 4/2000 | Aziz et al. ..................... 341/59 |
| 6,229,459 B1 | * | 5/2001 | Noda ............................. 341/59 |

OTHER PUBLICATIONS

"Analysis of Error Sequence for PRML and EPRML Signaling Performed Over Lorentzian Channel", R. Karabed et al., Globecom 96, (IEEE Global Telecommunications Conference 96) pp. 368–373.

"Maximum Transition Run Codes for Data Storage Systems", J. Moon et al., IEEE Trans. Mag., vol. 32, No. 5, pp. 3992–3994 (Sep. 1996).

"An 8/9 Rate Time–Varying Trellis Code for High Density Recording", W. Bliss, IEEE Magnetics Conference, International (InterMag) 97.

"Experimental Performance Comparison of FTDS/DFE Detectors: 8/9 (0,k) vs. 4/5 MTR Codes", Z. Keirn, IEEE Magnetics Conference, International (InterMag) 97.

"Distances Spectra for PRML Channels", S. Altekar et al., IEEE Magnetics Conference, International (InterMag) 97.

* cited by examiner

*Primary Examiner*—Michael Tokar
*Assistant Examiner*—Lam T. Mai
(74) *Attorney, Agent, or Firm*—Theodore M. Magee; Westman, Champlin & Kelly, P.A.

(57) ABSTRACT

An encoder is provided that converts data words into code words. The code words, when concatenated together, are such that sub-strings of consecutive first symbols in the code words have no more symbols than a maximum number; sub-strings having the maximum number of consecutive first symbols and beginning at selected locations within the code words appear without restriction, and sub-strings having the maximum number of consecutive first symbols and beginning at locations other than the selected locations appear only where the sub-string is concatenated with an acceptable secondary sub-string. A method is also provided for generating a set of such code words for an encoder.

21 Claims, 10 Drawing Sheets

METHOD AND APPARATUS FOR GENERATING CODE WORDS WITH SHIFTED TRIBIT ERROR PROTECTION

REFERENCE TO RELATED APPLICATIONS

The present application claims priority from a U.S. Provisional application having Ser. No. 60/101,323 that was filed on Sep. 22, 1998 and was entitled HIGH RATE TRELLIS CODES FOR DENSE DATA MAGNETIC STORAGE SYSTEMS.

BACKGROUND OF THE INVENTION

The present invention relates to encoding data for transmission through a channel and for decoding such encoded data after its transmission through a channel. In particular, the present invention relates to encoders and decoders in communication systems for information storage and retrieval.

Information that is transmitted from a source to a destination can be considered generically to pass through a channel. In some communication systems, the channel comprises electromagnetic radiation passing through the atmosphere. In other communication systems, the channel comprises a long conductor between the source and destination. Still other communication systems comprise a magnetic disk, where information from the source is stored on the disk and later retrieved from the disk for delivery to the destination.

In early storage systems, an analog read signal was generated from the disk and converted into digital data by assuming that a current digital value was unaffected by its predecessor values in the read signal. Later systems recognized that the writing and reading operations could be modeled as a communication channel and that this communication channel exhibited certain partial response characteristics in which neighboring values in the channel affected each other.

Using this channel model, many current systems utilize a Partial Response Maximum Likelihood (PRML) approach when attempting to detect and decode data read from a storage medium. Under PRML, a read signal is generated from the medium and sampled to produce a sequence of samples. These samples are then passed through a filter to fit the samples to a desired channel response. A detector then determines the most likely data sequence given the sequence of samples.

Before storing the data on the medium, most systems encode the data to improve certain performance characteristics. In particular, most codes attempt to limit the number of consecutive same symbols in the data. This is especially important in storage systems that detect physical transitions along the medium in order to read back data. In such systems, a binary "1" is typically written as a transition on the medium and a binary "0" is typically written as no transition. If there are too many consecutive 1's in the data, the transitions on the medium can interfere with each other. If there are too many consecutive 0's, the system is not able to generate an accurate read clock from the data.

Recently, some codes have been devised that limit the number of consecutive 1's to less than four. In such codes, it has been found that detection errors can occur when three consecutive 1's in a code word are mistakenly detected as beginning one code bit earlier or one code bit later than where they actually begin. This type of error has come to be known as a shifted tribit error.

To reduce the likelihood of a shifted tribit error, codes have been developed that limit the starting positions of tribits in the code word. (See W. Bliss, "An 8/9 rate time-varying trellis code for high density recording," Intermag 97; and P. Siegel et al.," An 8/9 rate trellis code for $E^2PR4$," presented UCSD CMRR, May 1997.) Under these codes, tribits are allowed to begin at either even code bit positions or odd code bit positions but not both. In a detector for such a code, detection paths that include tribits beginning outside of an allowed bit position are removed from consideration. Thus, a shifted tribit error cannot occur because a recovered word with a shifted tribit is not recognized as a valid code word.

Although such codes reduce tribit errors, they also reduce the number of available code words that can be used during encoding. In some cases, the reduction means that a particular code rate cannot be achieved because there are not enough code words. For example, a rate 9/10 code (9 data bits converted into 10 code bits), that prevents tribit shifting as discussed above would not have enough code words to support each of the possible data words. In other cases, the reduction in code words requires that code words with undesirably long sequences of consecutive 0's must be used. Thus, a code is needed that reasonably protects against tribit shift errors while providing more code words than current techniques.

SUMMARY OF THE INVENTION

An encoder is provided that converts data words into code words. The code words, when concatenated together, are such that sub-strings of consecutive first symbols in the code words have no more symbols than a maximum number; sub-strings having the maximum number of consecutive first symbols and beginning at selected locations within the code words appear without restriction, and sub-strings having the maximum number of consecutive first symbols and beginning at locations other than the selected locations appear only where the substring is concatenated with an acceptable secondary sub-string.

A method is also provided for generating a set of code words for an encoder. The method includes eliminating code words that have strings of consecutive first symbols that are longer than a maximum length and retaining some code words that have a string of consecutive first symbols that is as long as the maximum length if the string begins at a selected location. The method further includes retaining some code words that have a string of consecutive first symbols that is as long as the maximum length and that begins at a location other than a selected location if the string is concatenated with an acceptable sub-string. If the string of consecutive symbols is not concatenated with an acceptable sub-string, the code word is eliminated.

DETAILED DESCRIPTION OF ILLUSTRATIVE EMBODIMENTS

Figure 1:
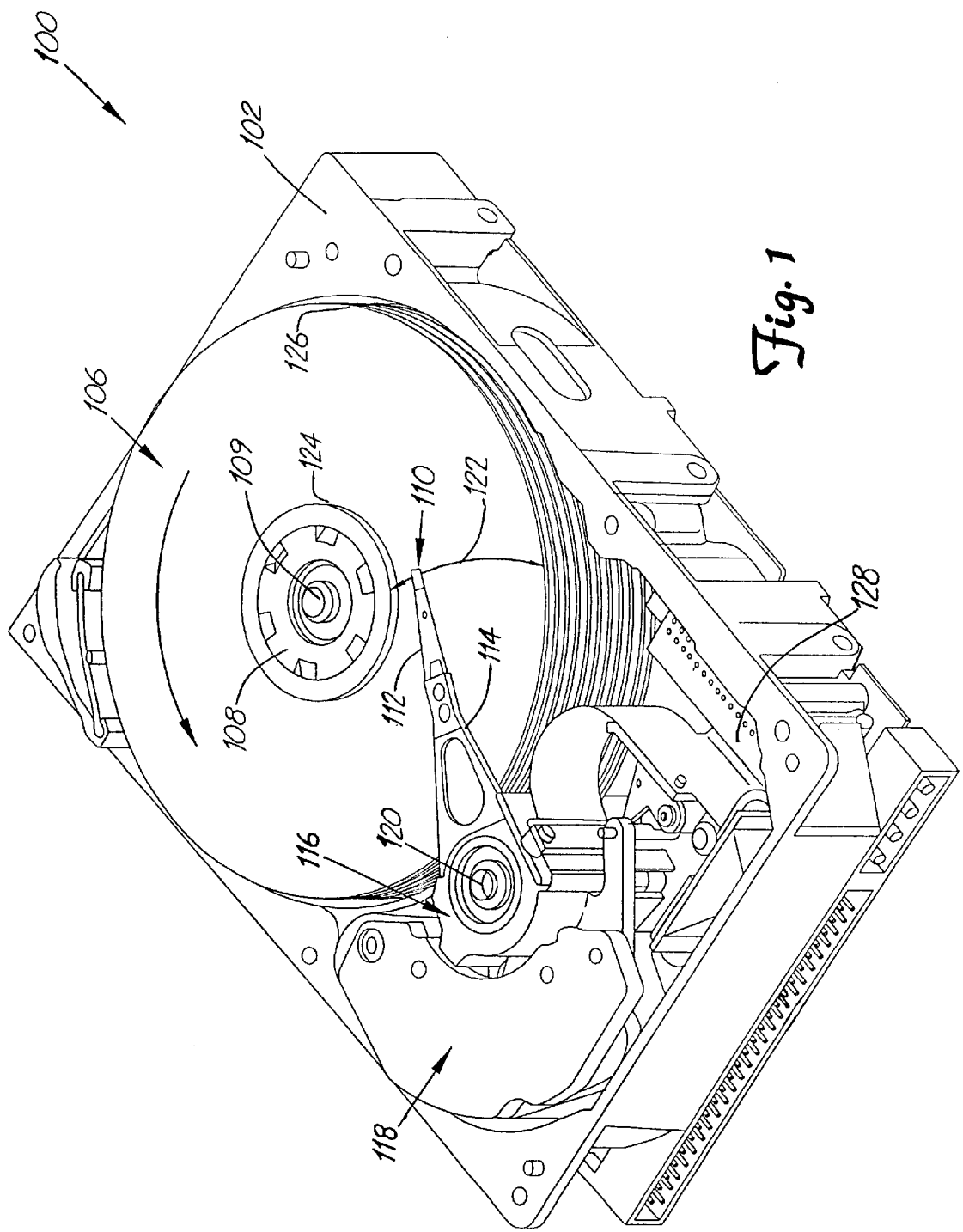
FIG. 1 is a perspective view of a disk drive in which some embodiments of the present invention are practiced.

FIG. 1 is a perspective view of a disc drive 100 in which the present invention is useful. Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated head 110, which is mounted to disc drive 100 for communication with the disc surface. In the example shown in FIG. 1, heads 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor operates under control of internal circuitry 128.

Write circuitry within internal circuitry 128 encodes the data to be stored into successive code words and sends the code words in the form of a serial analog write signal to a write transducer on head 110 which encodes magnetic flux reversals within a magnetic layer on the disc surface. During read operations, the read transducer in head 110 senses the magnetic flux reversals and generates a serial analog read signal. The analog read signal is converted into a serial digital signal, which is provided to detector and decoder circuitry within internal circuitry 128 to produce a recovered data signal as discussed further below.

Figure 2:
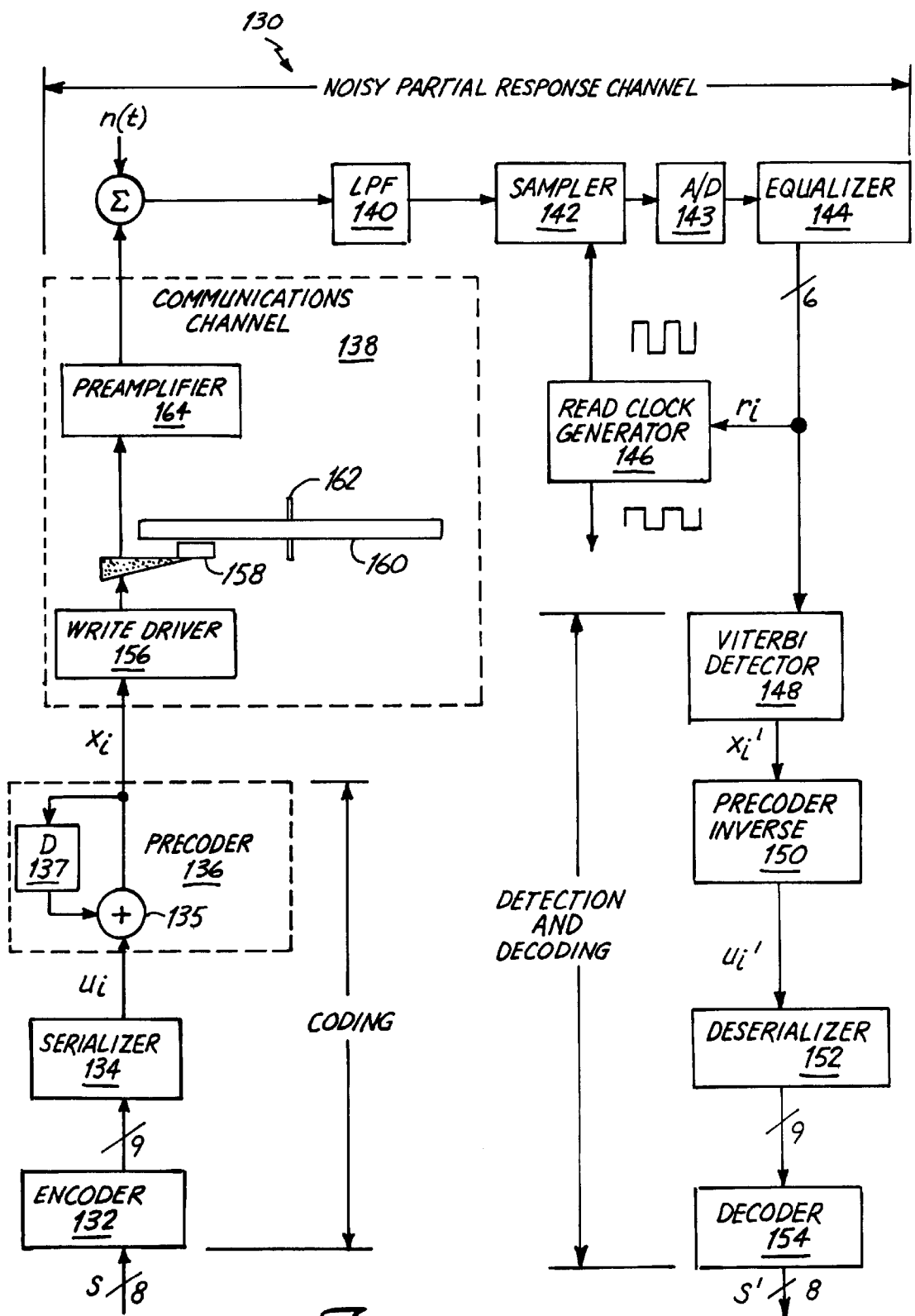
FIG. 2 is a block diagram of one embodiment of a system in which the present invention may be practiced.

FIG. 2 is a block diagram of a digital data storage system 130, in which the codes of the present invention are used. A succession of user data bytes, S, (each consisting of 8 binary bits in the embodiment of FIG. 2), is provided to an encoder 132, which maps each byte of user data into a corresponding code word (consisting of 9 bits in the embodiment of FIG. 2). Although an 8/9 code rate is shown in FIG. 2, other code rates are contemplated by the present invention as discussed further below.

Encoder 132 provides a succession of code words to a serializer 134, which accepts the parallel bits of each of the successive code words and places those bits in a serial sequence, $u_i$, which forms the input signal sequence for a precoder 136.

Precoder 136 converts the serial sequence of code words from a non-return to zero inverse (NRZI) format to a non-return to zero (NRZ) format. Under a NRZI format, each "1" represents a transition in a physical property of the recording medium and a "0" represents no transition. Under a NRZ format, a "1" represents one property state for the recording medium and a "0" represents a second property state for the medium. In the embodiment of FIG. 2, precoder 136 performs the conversion by performing an exclusive— OR function between a current bit of the sequence of NRZI code word bits and a previous bit in the sequence of NRZ code word bits. This is shown in FIG. 2 with an exclusive— OR block 135, which receives the NRZI code bits from serializer 134 and the delayed sequence of NRZ code bits from delay block 137, which is connected to the output of exclusive—OR block 135. The output of precoder 136 is a serial data bit output sequence, $x_i$.

The precoder output sequence is provided to a communications channel 138, which in the embodiment of FIG. 2 is a disc drive storage system that includes a disc 160. Disc 160 rotates about a spindle 162 and contains state transitions organized in concentric tracks around the disc. The state transitions are "written" onto the medium by a write head and "read" from the medium by a read head. These heads are represented generically in FIG. 2 by head 158. For the embodiment of FIG. 2, before writing the output sequence $x_i$ to the medium, the sequence is converted from a voltage signal to a current signal and is suitably scaled by a write driver 156.

The information is read from the disc by positioning head 158 near a desired track. Head 158 "reads" data from the disc by generating or modifying an analog electrical signal based on the different states of the disc's medium. This electrical signal is then suitably amplified by a pre-amplifier amplifier 164 to provide a communications channel output. During the writing and reading process, the respective signals are corrupted by additive wideband noise. This corruption is shown representatively in FIG. 2 by the summing of an ideal communications output signal from pre-amplifier 164 with the a noise signal n(t).

The noisy output signal from communications channel 138 is then filtered and amplified by a low-pass filter 140. The filtered signal is then synchronously sampled by a sample and hold converter 142, in response to a regenerated time reference, or "read clock", produced by a read clock generator 146. The output of sampler 142 is an analog signal that is provided to an analog-to-digital (A/D) converter 143, which typically produces a 6 bit binary representation of each sample. In alternative embodiments, the A/D converter is placed at the output of low-pass filter 140 and provides an asynchronous digitized signal to the sampler. The sampler then samples the digitized signal and provides the samples to equalizer 144.

The digital samples from (A/D) converter 143 are input to a typically transversal filter, or "equalizer", 144 to produce an equalized channel signal. Equalizer 144 modifies the digital samples so that the overall transfer function, from the input of communications channel 138 to the output of equalizer 144, matches a desired channel transfer function, p(D). A noiseless output signal, y(D), from equalizer 144 can then be described as:

$$y(D)=P(D)=(D) \qquad \text{EQ. 1}$$

where y(D) is the noiseless component of the equalizer's output signal, x(D) is the input signal to conmmunications channel 138, and P(D) is the transfer function of the channel.

Typically, the desired transfer function of the channel is of the form:

$$P(D)=(1-D)(1-D)^k \qquad \text{EQ. 2}$$

where P(D) is the channel transfer function and D represents a delay of one bit, with each power of D representing an additional delay.

Under one embodiment of the present invention, the transfer function provides an EPR4 channel where k=2 in Equation 2 or:

$$P_{EPR4}(D)=1+D-D^2-D^3 \qquad \text{EQ. 3}$$

Combining Equations 1 and 3 and rewriting the result in terms of the ith noiseless output bit, yi, results in:

$$y_i=X_i+X_{i-1}-X_{i-2}X_{i-3} \qquad \text{EQ. 4}$$

Under a second embodiment of the present invention, the transfer function provides an $E^2PR4$ channel where k=3 or:

$$P_{E^2PR4}(D)=1+2D-2D^3-D^4 \qquad \text{EQ. 5}$$

which when combined with Equation 1 and rewritten in terms of $y_i$ becomes:

$$y_i=x_i+2x_{i-1}-2x_{i-3}-x_{i-4} \qquad \text{EQ. 6}$$

As noted above, however, the ideal signal is corrupted by additive noise n(t). This additive noise may be represented in the equations above by adding a term $n_i$ to the equations. This produces an equation for the actual samples, $r_i$, output by equalizer 144 of:

$$r_i=y_i+n_i \qquad \text{EQ. 7}$$

The resulting signal, r(D), is provided to the input of clock generator 146, which uses the signal to regenerate a time clock that is synchronous with the period of the binary data embedded in the resulting signal. The resulting signal, r(D), is also provided to a detector 148, which in many embodiments is a Viterbi detector, and which in the embodiment of FIG. 2 is a radix-2 Viterbi detector. A radix-2 detector is a detector that operates at the sampling rate of sampler 142.

From the channel samples, r(D), the detector determines a maximum likelihood estimate of a binary bit sequence, x'(D), which led to such samples. This estimate represents the most likely values output by precoder 136 given the channel samples.

A precoder inverse 150 receives the estimated binary sequence produced by detector 148 and performs the inverse operation of the preceding operation of precoder 136. In one embodiment, precoder inverse 150 performs this function by performing an EXCLUSIVE-OR function on the then-current bit $x_i$ and the next previous bit $x_{i-1}$. This produces an estimated signal, u'(D), which represents an estimate of the signal u(D) input to precoder 136.

The output sequence, u'(D), of precoder inverse 150, is converted into parallel blocks of 9 bits, i.e. deserialized, by a deserializer 152. These blocks are then decoded by a decoder 154 to produce an estimate of the user's original data, S'.

Figure 3:
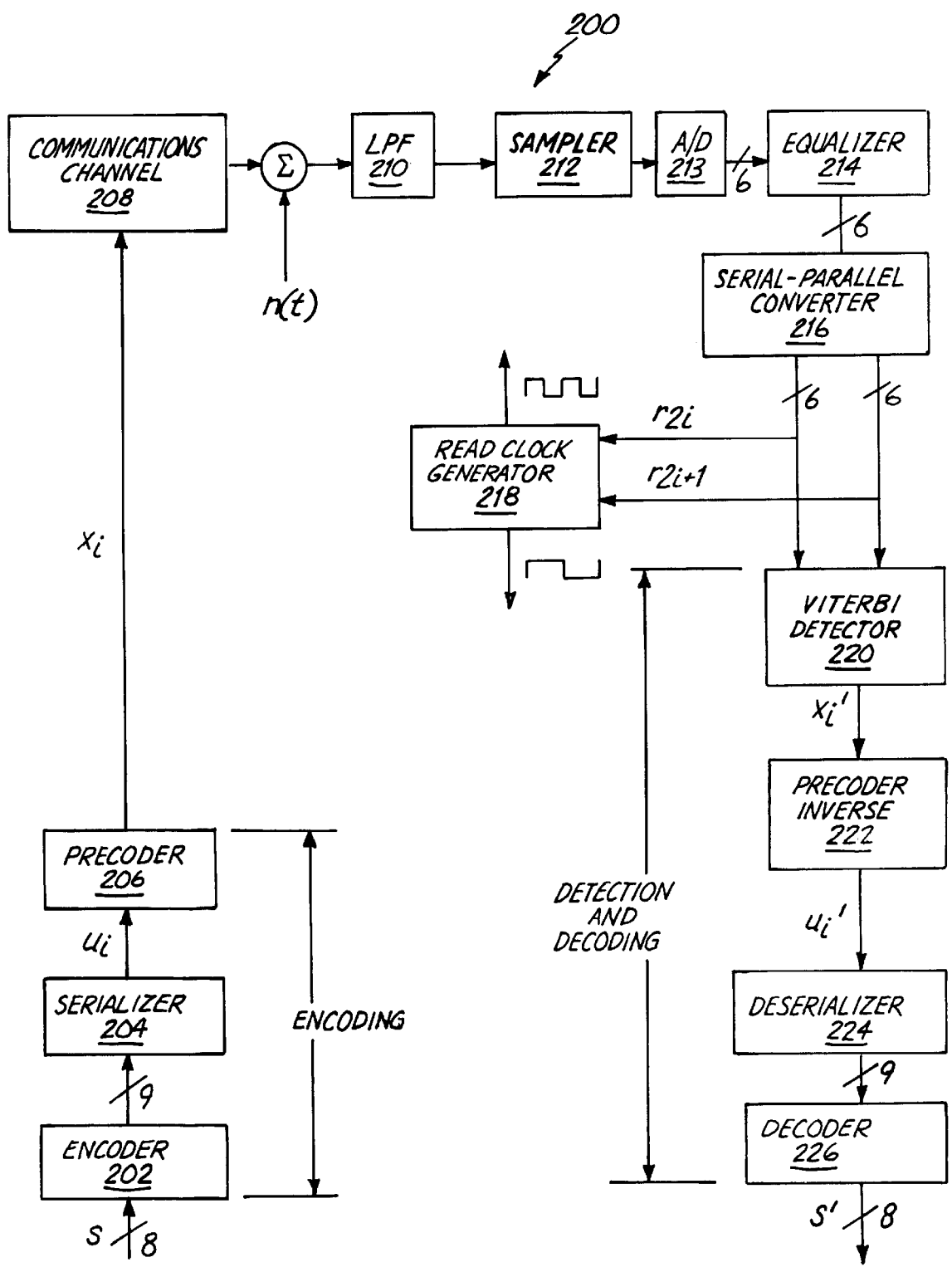
FIG. 3 is a block diagram of a second embodiment of a system in which the present invention may be practiced.

FIG. 3 shows a block diagram of an alternative digital data storage system 200, in which embodiments of the codes of the present invention are used. In storage system 200, a radix-4 Viterbi detector is used instead of the radix-2 detector of storage system 130 of FIG. 2. The readix-4 detector is able to process two samples at a time and thus is able to operate at half the data rate of sampler 212.

In FIG. 3, encoder 202, serializer 204, precoder 206, communications channel 208, low pass filter 210, sampler 212, A/D converter 213, equalizer 214, precoder inverse 222, deserializer 224 and decoder 226 perform the same respective functions as encoder 132, serializer 134, precoder 136, communications channel 138, low pass filter 140, sampler 142, A/D converter 143, equalizer 144, precoder inverse 150, deserializer 152 and decoder 154 of FIG. 2.

To accommodate the radix-4 detector, storage system 200 utilizes a serial-to-parallel converter 216 after equalizer 214. Converter 216 receives the sequence of digital samples, r(D), from equalizer 214 at the bit rate and outputs successive pairs of digital samples at half the bit rate, the ith such pair consisting of received samples $r_i$ and $r_{i+1}$. A read clock generator 218 regenerates the read clock as discussed above for FIG. 2 and also generates a half bit rate clock by dividing the read clock by 2. This half bit rate clock is then used to set the rate of detection in detector 220.

Each detector described above, is susceptible to error events in which the detector detects the wrong sequence of bits. If we assume noiseless operation of the channel, such error events can be attributed to an error sequence at the channel input, where the error sequence, $e_x(D)$ is defined as:

$$e_x(D)=x(D)-x'(D) \qquad \text{EQ. 8}$$

where $e_x(D)$ is the error sequence, x(D) is the precoder output and x'(D) is the detector output. Passing the error sequence through the channel results in a corresponding error sequence, $e_y(D)$, at the channel output defined as:

$$e_y(D)=P(D)[x(D)-x'(D)] \qquad \text{EQ. 9}$$

Given these definitions, an error event,"$\lambda$", is said to extend from time $k_1$ to time $k_2$ if:

$e_{x,k_1-k-k}\times 0$ for all $0<k\le\text{degree}[p(D)]$  (i)

$e_{x,k_1}=0$, and  (ii)

$k_2$ is the smallest value of $k>k_1$ for which $e_{x,k-j}0$ for all $0<j<\text{degree}[p(D)]$  (iii)

The squared distance of the error event is given by:

$$d^2(\lambda) = \sum_{k=k_1}^{k_2} (e_{y,k})^2. \qquad \text{EQ. 10}$$

Four families of error events (and their inverses) are of particular interest under the present invention because they have been found to be the smallest distance error events for the EPR4 and $E^2PR4$ partial response channels. These four events can be described in the NRZ notation of the channel input error sequence $e_x$ as:

$e_x^{(1)}$:000+1−1[+1−1]000, $e_x^{(2)}$:000+1[−1+1]000, $e_x^{(3)}$:000+1−1+100+1−1+1000, and $e_x^{(4)}$:000+1[0+1]000.

Where the notation [mn] indicates families of error events that can have that pattern mn of channel input error symbols repeat one or more times in succession without corresponding increases in the error event squared distance.

Error events $e_x^{(1)}$, $e_x^{(2)}$, and $e_x^{(4)}$ have been found to be the only error events of squared distance four on EPR4 channels, and error events $e_x^{(1)}$, $e_x^{(2)}$, and $e_x^{(3)}$ have similarly been found to be the only error events of squared distance less than ten on $E^2PR4$ channels. Error events $\{e_x^{(1)}, e_x^{(2)}\}$ have been found to be the most probable, or dominant, error events on Lorentzian channels equalized to the EPR4 partial response characteristic in the presence of greater densities of data storage in the magnetic media. Error events $e_x^{(1)}$, $e_x^{(2)}$, and $e_x^{(3)}$ can be eliminated through effective coding choices with corresponding detector constraints as shown below, and the length of error events $e_x^{(4)}$ can be limited through elimination of quasi-catastrophic sequences in the detector either directly or as the result of other constraints. Quasi-catastrophic sequences are those allowing error events to occur that are of a finite distance but of indefinite length such as those shown in brackets above.

Consider the first family of error events given above, $e_x^{(1)}$:000+1−1[+1−1]000.

For such an error event to occur, the detector makes an error in distinguishing between the NRZ format channel input subsequences $$S_x^{(1)} = ABC10[10]DEF$$

and $$S_x^{(2)} = ABC01[01]DEF,$$

where A, B, C, D, E, and F are arbitrary channel input symbols. The corresponding precoder channel input bits in NRZI coded format are $$S_u^{(1)} = \ldots \overline{C}1[11]D \ldots,$$

and $$S_u^{(2)} = \ldots C1[11]\overline{D} \ldots,$$

where a bar over a symbol indicates the complement of the symbol.

At least one of these subsequences contains four consecutive transitions, or four consecutive NRZI "1" values, i.e. a quadbit, for the four possible joint binary digit value combinations for C and D. Thus, this error can be eliminated by (a) creating an encoder that does not use code words that have quadbits, and by (b) designing the detector so that it is prevented from selecting a survivor path corresponding to a quadbit.

For the second family of error events given above, $$e_x^{(2)}:000+1[-1+1]000.$$

For such an error event to occur, the detector makes an error in distinguishing between the NRZ format channel input subsequences $$S_x^{(1)} = ABC1[01]DEF$$

and $$S_x^{(2)} = ABC0[10]DEF,A,B,$$

where A, B, C, D, E, and F are arbitrary channel input symbols. The corresponding precoder input bits in NRZI coded format are:

$$s_u^{(1)} = \ldots G\overline{C}[11]\overline{D}H \ldots$$

and $$S_u^{(2)} = GC[11]DH \ldots,$$

where G = B⊕C, HD = D⊕E, and ⊕ is an EXCLUSIVE-OR operation.

If C and D are equal, one of these subsequences contains four consecutive transitions or NRZI "1" values. As such, this error is not possible when code words with quadbits are not allowed as discussed above. If C and D are not equal, a subsequence of three consecutive transitions or NRZI "1" values forming a tribit, is mistakenly detected as beginning one bit earlier or one bit later than the beginning of the actual channel input tribit. For example, G1110H is mistaken for G0111H.

As mentioned above, to eliminate such error events, prior art codes constrain tribits so that they only begin at selected locations within a code word. Specifically, under the prior art, if tribits are allowed to begin at time interval i, tribits are not allowed to begin either at time i−1 or at time i+1. Thus, using the sequence above, the prior art would allow the sequence 1110 but reject the all sequences of 0111.

Under the present invention, it has been recognized some of the sequence rejected by the prior art can be retained without significantly increasing the probability of an error event occurring. Specifically, the present invention recognizes that sequences of the form 10111 can be allowed in a set of code words where 01110 is a valid code sequence.

Allowing sequences of the form 10111 and sequences of the form 01110 to exist in the same code set can be justified based on the fact that the error distance between 10111 and 01110 is much larger than the error distance between 00111 and 01110. Thus, by eliminating sequences of the form 00111, the main source of error attributed to shifting tribits can be eliminated without eliminating all possible shifted tribit sequences.

The differences in the error distances of the two sequences 00111 and 10111 relative to the sequence 01110 are shown in Table 1 below. The second column of the table shows the relationship between the 10111 sequence and the 01110 sequence and the third column shows the relationship between the 00111 sequence and the 01110 sequence.

The first row of each column shows the NRZ (NRZI) representation of the 01110 sequence given a previous value of P. The second row shows the NRZ (NRZI) representation of the 10111 and 00111 sequences in the second and third columns, respectively, again with a previous value of P. The third row shows a channel input error sequence based on the difference between the NRZ sequence for the 01110 sequence and the two other NRZ sequences.

Thus, the second column of the third row shows the difference between the NRZ sequences for the 01110 and 10111 sequences and the third column of the third row shows the difference between the NRZ sequences for the 01110 and 00111 sequences. The fourth row of Table 1 shows the corresponding channel output error sequence for an EPR4 channel that results from the channel input error sequences of the third row passing through the channel. The fifth row of Table 1 shows the corresponding channel output error sequences for an E²PR4 channel based on the channel input error sequences of the third row.

TABLE 1

| | | |
|---|---|---|
| Allowed Tribit NRZ (NRZI) | P, P, $\overline{P}$, P, $\overline{P}$, $\overline{P}$ (0,1,1,1,0) | P, P, $\overline{P}$, P, $\overline{P}$, $\overline{P}$ (0,1,1,1,0) |
| Restricted Tribit NRZ (NRZI) | P, $\overline{P}$, $\overline{P}$, P, $\overline{P}$, P (1,0,1,1,1) | P, P, P, $\overline{P}$, P, $\overline{P}$ (0,0,1,1,1) |
| NRZ Difference Sequence | 0, +1, 0, 0, 0, −1 | 0, 0, −1, +1, −1, 0 |
| EPR4 Output Difference Sequence | 0, +1, +1, 31 1, −1, −1, −1, +1, +1 | 0, 0, −1, 0, +1, +1, 0, +1, 0 |
| E²PR4 Output Difference Sequence | 0, +1, +2, 0, −2, −2, −2, 0, +2, +1 | 0, 0, −1, −1, +1, 0, −1, +1, +1, 0 |

The sum of squares of the channel output error sequences in the fourth row of Table 1 gives an observed distance of $d^2 = 8$ in an EPR4 channel for the 10111 sequence, compared with a distance $d^2 = 4$ for the 00111 sequence. The sum of squares of the channel output error sequences of the fifth row gives an observed distance of $d^2=22$ at the output of an $E^2PR4$ channel for the 10111 sequence, compared with a distance $d^2 = 6$ for the 00111 sequence. Thus, in either channel, the distance between the 01110 sequence and the 10111 sequence is much greater than the distance between the 01110 sequence and the 00111 sequence. Therefore, the present invention recognizes that the dominant error can be removed even if the 10111 sequence is retained as long as the 00111 sequence is eliminated.

Table 2 below shows that the large distance between the 01110 sequence and the 10111 sequence is maintained even if they are preceded by different starting values, P and $\overline{P}$. In the sequences of Table 2, the observed distances are d2=10 on EPR4, and d2=18 on E2PR4.

TABLE 2

| Allowed Tribit NRZ (NRZI) | $P,P,\overline{P},P,\overline{P},\overline{P}$ (0, 1, 1, 1, 0) |
|---|---|
| Restricted Tribit NRZ (NRZI) | $\overline{P},P,P,\overline{P},P,\overline{P}$ (1, 0, 1, 1, 1) |
| NRZ Difference Sequence | +1, 0, −1, +1, −1, 0 |
| EPR4 Output Difference Sequence | +1, +1, −2, −1, +1, −1, 0, +1 |
| $E^2PR4$ Output Difference Sequence | +1, +2, −1, −3, 0, 0, −1, +1, +1 |

Both the EPR4 channel and the $E^2PR4$ channel can be shown to be symmetric with respect to time reversals so that the same results are found for the subsequences 01110, 11101, and 11100 as were found above for subsequences 01110, 10111, and 00111.

Based on the above, the present. invention partitions NRZI sequences of the form X0111 into two sets. Sequences containing 00111 are not be used in conjunction with allowed sequences of the form 01110, but sequences 10111 are used freely with allowed sequences of the form 01110. Similarly, sequences of the form 1110X are partitioned into two sets, with 11100 sequences discarded and 11101 sequences retained.

For the third family of error events:

$$e_x^{(3)}: 000+1-1+100+1-1+100,$$

the detector makes an error in distinguishing between the NRZ format channel input sequences $$S_x^{(1)} = ABC101DE101FGH$$

and $$S_x^{(2)} = ABC010DE010FGH$$

where A, B, C, D, E, F, G and H are arbitrary channel input symbols. If the detector is constrained to disallow quadbits, as indicated above, and either C equals D or E equals F, one of these sequences is disallowed by the detector because one of the corresponding precoder input sequences in NRZI notation will have a quadbit. Thus, $\overline{C}$ must equal D and $\overline{E}$ must equal F in order for these sequences to be confused with each other. This produces:

$$S_x^{(1)} = ABC101\overline{C}E101\overline{E}GH$$

and $$S_x^{(2)} = ABC010\overline{C}E010\overline{E}GH$$

As a result, $\overline{C}$ must equal E or one of these subsequences is disallowed by the detector because one of the corresponding precoder input subsequences in NRZI will have a quadbit. Requiring $\overline{C}$ to equal E yields:

$$S_x^{(1)} = ABC101\overline{CC}101CGH$$

and $$S_x^{(1)} = ABC010\overline{CC}010CGH$$

The corresponding precoder input sequences in NRZI are:

$$S_u^{(2)}: B \oplus \overline{CC}11C0C11\overline{CC} \oplus G$$

and $$S_u^{(2)}: B \oplus CC11\overline{C0C}11CC \oplus G.$$

By letting $I = B \oplus C$, and $J = C \oplus G$, and setting C equal to either "0" or "1" results in:

... I1111000111J ...

... I011101110J ...

To avoid a quadbit in either of the above sequences, I=J=0. With those values, at least one of the sequences contains a sequence of 00111 in the bit positions where the other sequences contains 01110. Thus, the removal of the 00111 sequence for a freely allowed sequence 01110, as described above, eliminates the possibility of this error.

Using the partitioning strategy described above, a rate 7/8 block code is constructed under the present invention that has a maximum of 8 consecutive zeros for any possible concatenation of code words, a maximum of 3 consecutive ones for any possible concatenation, and that significantly reduces the occurrence of a shifted tribit error. A listing showing one possible collection of such code words is shown in Table 3. Within the code of Table 3, tribits of the form 01110XXX and XX01110X are freely allowed in the code words, where X indicates either a 0 or a 1. In addition, using the partitioning strategy described above, code words 00101110, 10101110 and 01101110 are also allowed.

TABLE 3

| | | | | | | | |
|---|---|---|---|---|---|---|---|
| 00001000 | 00001001 | 00001010 | 00001100 | 00001101 | 00010000 | 00010001 | 00010010 |
| 00010100 | 00010101 | 00010110 | 00011000 | 00011001 | 00011010 | 00011100 | 00011101 |
| 00100001 | 00100010 | 00100100 | 00100101 | 00100110 | 00101000 | 00101001 | 00101010 |
| 00101100 | 00101101 | 00101110 | 00110000 | 00110001 | 00110010 | 00110100 | 00110101 |
| 00110110 | 01000001 | 01000010 | 01000100 | 01000101 | 01000110 | 01001000 | 01001001 |
| 01001010 | 01001100 | 01001101 | 01010000 | 01010001 | 01010010 | 01010100 | 01010101 |
| 01010110 | 01011000 | 01011001 | 01011010 | 01011100 | 01011101 | 01100001 | 01100010 |
| 01100100 | 01100101 | 01101000 | 01101001 | 01101010 | 01101100 | 01101101 | 01101110 |
| 01110000 | 01110001 | 01110010 | 01110100 | 01110101 | 01110110 | 10000001 | 10000010 |
| 10000100 | 10000101 | 10000110 | 10001000 | 10001001 | 10001010 | 10001100 | 10001101 |
| 10010000 | 10010001 | 10010010 | 10010100 | 10010101 | 10010110 | 10011000 | 10011010 |

TABLE 3-continued

| | | | | | | | |
|---|---|---|---|---|---|---|---|
| 10011100 | 10011101 | 10100001 | 10100010 | 10100100 | 10100101 | 10100110 | 10101000 |
| 10101001 | 10101010 | 10101100 | 10101101 | 10101110 | 10110000 | 10110001 | 10110010 |
| 10110100 | 10110101 | 10110110 | 11000001 | 11000010 | 11000100 | 11000101 | 11000110 |
| 11001000 | 11001001 | 11001010 | 11001100 | 11000010 | 11010000 | 11010001 | 11010010 |
| 11010100 | 11010101 | 11010110 | 11011000 | 11011001 | 11011010 | 11011100 | 11011101 |

The set of code words of Table 3 provides an advantage over code word sets of the prior art. Specifically, by not removing code words 00101110, 01101110, and 10101110 when freely allowing the sequences 01110XXX and XX01110X, the present invention provides more possible code words than the prior art, which eliminates all sequences of the forms X01110XX and XXX01110when 01110XXX and XX01110X are freely allowed. Because of the added code words, the present invention is able to produce a code with a maximum run length of 8 zeros as opposed to the maximum run length of 9 zeros found in prior art codes. Moreover, the present invention achieves its maximum run length of 8 zeros while maintaining the same goals of prior art codes. Namely, eliminating quadbits and quasi-catastrophic subsequences and reducing the chances of a shifted tribit error.

A 7/8 rate encoder can be constructed by assigning each of the 128 possible 7-bit data words to a unique member of the list of available code words in Table 3. Such a mapping is bijective such that there is a one-to-one correlation between data words and code words and all of the code words are exhausted. By definition, any bijective map is invertible, and a decoder is constructed by assigning each code word to one of the 7-bit data words.

The code of Table 3 can be changed under the present invention to provide an alternate code that includes a further constraint requiring each code word to have at least two 1's. A code with this further constraint is shown below in Table 4. As with the code of Table 3, code words of the form 01110XXX and XX01110X are freely allowed in the code of Table 4. In addition, using the partitioning strategy described above, code words of the form 101110XX and XX101110 are also allowed. Note that the code of Table 4 uses code words of the form XX101110 instead of code words of the form XX011101 as found in Table 3.

TABLE 4

| | | | | | | | |
|---|---|---|---|---|---|---|---|
| 00001001 | 00001010 | 00001100 | 00001101 | 00001110 | 00010001 | 00010010 | 00010100 |
| 00010101 | 00010110 | 00011000 | 00011001 | 00011010 | 00011101 | 00100001 | 00100010 |
| 00100100 | 00100101 | 00100110 | 00101000 | 00101001 | 00101010 | 00101100 | 00101101 |
| 00101110 | 00110000 | 00110010 | 00110100 | 00110010 | 00110101 | 00110110 | 01000001 |
| 01000010 | 01000100 | 01000101 | 01000110 | 01001000 | 01001001 | 01001010 | 01001100 |
| 01001101 | 01001110 | 01010000 | 01010001 | 01010010 | 01010100 | 01010101 | 01010110 |
| 01011000 | 01011001 | 01011010 | 01011101 | 01100001 | 01100010 | 01100100 | 01100101 |
| 01101000 | 01101001 | 01101010 | 01101100 | 01101101 | 01101110 | 01110000 | 01110001 |
| 01110010 | 01110100 | 01110101 | 01110110 | 10000001 | 10000010 | 10000100 | 10000101 |
| 10000110 | 10001000 | 10001001 | 10001010 | 10001100 | 10001101 | 10001110 | 10010000 |
| 10010001 | 10010010 | 10010100 | 10010101 | 10010110 | 10011000 | 10011010 | 10011101 |
| 10100001 | 10100010 | 10100100 | 10100101 | 10100110 | 10101000 | 10101001 | 10101010 |
| 10101100 | 10101101 | 10101110 | 10110000 | 10110010 | 10110010 | 10110100 | 10110101 |
| 10110110 | 10111000 | 10111001 | 10111010 | 11000001 | 11000010 | 11000100 | 11000101 |
| 11000110 | 11001000 | 11001001 | 11001010 | 11001100 | 11001101 | 11001110 | 11010000 |
| 11010001 | 11010010 | 11010100 | 11010101 | 11010110 | 11011000 | 11011001 | 11011010 |
| 11011101 | | | | | | | |

The code of Table 4 provides 129 code words for encoding the 128 possible 7-bit data words. The extra code word can be used under an embodiment of the present invention to further reduce the likelihood of a shifted tribit error. In particular, it is noted that in the code of Table 4 only two code words differ solely on the basis of a shifted tribit. Those code words are 10111001 (last column of the eleventh row) and 10111001 (third column of the fourteenth row) of Table 4. To eliminate the chance that one of these code words will be mistaken for the other, this embodiment of the invention assigns both code words to the same data word. Thus, even if one code word is mistaken for the other, the same data word will be recovered.

Under other embodiments of the invention, the coding methodology described above is used to provide rate 8/9 codes, where 8 bits of user data are converted into 9 bit code words. Two such codes are described below, with the first code being referred to as a "Phase 0" code and the second being referred to as a "Phase 1" code, for reasons discussed further below.

To construct the two codes, the following constraints are imposed on each nine bit NRZI code word having a bit layout $\{u_8 u_7 u_6 u_5 u_4 u_3 u_2 u_1 u_0\}$: Reject any code words containing (i) $u_1 u_0 = 11$ or $$u_8 u_7 u_6 = 111 \quad \text{(ii)}$$

to form the code word boundary constraints.

Reject any code words containing $$u_4 u_3 u_2 u_1 = 1111 \quad \text{(iii)}$$

or $$u_5 u_4 u_3 u_2 = 1111 \quad \text{(iv)}$$

or $$u_6 u_5 u_4 u_3 = 1111 \quad \text{(v)}$$

or $$u_7 u_6 u_5 u_4 = 1111 \quad \text{(vi)}$$

to eliminate quadbits.

Reject, though an optional choice, the sequence $$u_8u_7u_6u_5u_4u_3u_2u_1=000000000 \quad \text{(vii)}$$

to prevent an all zeroes code word.

Reject, though again an optional choice, the code words containing $$u_8u_7u_6u_5u_4u_3u_2u_1u_0=110011001 \quad \text{(viii)}$$

or $$u_8u_7u_6u_5u_4u_3u_2u_1u_0=001100110 \quad \text{(ix)}$$

to prevent quasi-catastrophic code words.

A further option is to reject sequences containing 6 beginning or ending zeroes if the run length of zeroes in the code is to be limited to 10, that is, reject code words having $$u_8u_7u_6u_5u_4u_3=000000 \quad \text{(x)}$$

or $$u_5u_4u_3u_2u_1u_0=000000. \quad \text{(xi)}$$

The constraints listed above are common to both the Phase 0 and the Phase 1 codes. The two codes are differentiated from each other by two sets of additional constraints that are unique to each code. These additional constraints eliminate tribits from certain locations in each code word if the tribits are not preceded by a "10" sequence or followed by a "01" sequence. The difference between the constraints of each code is the location for allowed tribits. Specifically, the Phase 0 code constraints freely allow tribits that begin at even locations but require tribits that begin at odd locations to be preceded by "10" or followed by "01". The Phase 1 code constraints freely allow tribits that begin at odd locations but require tribits that begin at even locations to be preceded by "10" or followed by "01". Thus, the additional Phase 0 constraints reject code words where:

$$u_7u_6u_5u_3=1110 \quad \text{(xii)}$$

or $$u_7u_5u_4u_3=0111 \quad \text{(xiii)}$$

or $$u_5u_4u_3u_1=1110 \quad \text{(xiv)}$$

or $$u5u_3u_2u_1=0111, \quad \text{(xv)}$$

and the additional Phase 1 constraints reject code words where:

$$u_8u_6u_5u_4=0111 \quad \text{(xii')}$$

or $$u_6u_5u_4u_2=1110 \quad \text{(xiii')}$$

or $$u_6u_4u_3u_2=0111 \quad \text{(xiv')}$$

or $$u_4u_3u_2u_0=1110. \quad \text{(xv')}$$

Tables 5 through 8 list the available nine bit sequences in NRZI coded format for the Phase 0 and Phase 1 codes. Table 5 is a list of 236 common code words that can be used for both codes. Table 6 lists an additional 20 sequences for the Phase 0 code bringing the total number of available sequences in that code to 256. Table 7 lists an additional 23 sequences for the Phase 1 code bringing the total number of available sequences in that code to 259. Table 8 lists an additional 11 possible sequences for either code. These sequences are unused in most embodiments to avoid long run lengths of zeroes at code word boundaries.

TABLE 5

| Phase 0 and Phase 1 code words | | | | | | | |
|---|---|---|---|---|---|---|---|
| 000001000 | 000001001 | 000001010 | 000001100 | 000001101 | 000010000 | 000010001 | 000010010 |
| 000010100 | 000010101 | 000010110 | 000011000 | 000011001 | 000011010 | 000100000 | 000100001 |
| 000100010 | 000100100 | 000100101 | 000100110 | 000101000 | 000101001 | 000101010 | 000101100 |
| 000101101 | 000101110 | 000110000 | 000110001 | 000110010 | 000110100 | 000110101 | 000110110 |
| 001000001 | 001000010 | 001000100 | 001000101 | 001000110 | 001001000 | 001001001 | 001001010 |
| 001001100 | 001001101 | 001010000 | 001010001 | 001010010 | 001010100 | 001010101 | 001010110 |
| 001011000 | 001001001 | 001011010 | 001011101 | 001100000 | 001100001 | 001100010 | 001100100 |
| 001100101 | 001101000 | 001101001 | 001101010 | 001101100 | 001101101 | 001101110 | 010000001 |
| 010000010 | 010000100 | 010000110 | 010000101 | 010000110 | 010001001 | 010001010 | 010001100 |
| 010001101 | 010010000 | 010010001 | 010010010 | 010010100 | 010010101 | 010010110 | 010011000 |
| 010011001 | 010011010 | 010100000 | 010100001 | 010100010 | 010100100 | 010100101 | 010100110 |
| 010101000 | 010101001 | 010101010 | 010101100 | 010101101 | 010101110 | 010110000 | 010110001 |
| 010110010 | 010110100 | 010110110 | 010111010 | 010111100 | 011000001 | 011000010 | 011000100 |
| 011000101 | 011001100 | 011001000 | 011001001 | 011001010 | 011001100 | 011001101 | 011010000 |
| 011010001 | 011010010 | 011010100 | 011010101 | 011010110 | 011011000 | 011011001 | 011011010 |
| 011011101 | 011101000 | 011101001 | 011101010 | 011101100 | 011101101 | 011101110 | 100000001 |
| 100000010 | 100000100 | 100000101 | 100000110 | 100001000 | 100001001 | 100001010 | 100001100 |
| 100001101 | 100010000 | 100010001 | 100010010 | 100010100 | 100010101 | 100010110 | 100011000 |
| 100011001 | 100011010 | 100100000 | 100100001 | 100100010 | 100100100 | 100100101 | 100100110 |
| 100101000 | 100101001 | 100101010 | 100101100 | 100101101 | 100101110 | 100110000 | 100110001 |
| 100110010 | 100110100 | 100110110 | 100110110 | 101000001 | 101000010 | 101000100 | 101000101 |
| 101000110 | 101001000 | 101001001 | 101001010 | 101001100 | 101001101 | 101010000 | 101010001 |
| 101010010 | 101010100 | 101010101 | 101010110 | 101011000 | 101011001 | 101011010 | 101011101 |
| 101100000 | 101100001 | 101100010 | 101100100 | 101100101 | 101100110 | 101101000 | 101101001 |
| 101101010 | 101101100 | 101101101 | 101101110 | 101110100 | 101110101 | 101110110 | 110000001 |
| 110000010 | 110000100 | 110000101 | 110000110 | 110001000 | 110001001 | 110001010 | 110001100 |
| 110001101 | 110010000 | 110010001 | 110010010 | 110010100 | 110010101 | 110010110 | 110011000 |
| 110011010 | 110100000 | 110100001 | 110100010 | 110100100 | 110100101 | 110100110 | 110101000 |

TABLE 5-continued

Phase 0 and Phase 1 code words

| | | | | | | | |
|---|---|---|---|---|---|---|---|
| 110101001 | 110101010 | 110101100 | 110101101 | 110101110 | 110110000 | 110110001 | 110110010 |
| 110110100 | 110110101 | 110110110 | 110111010 | | | | |

TABLE 6

Phase 0 code words

| | | | | | | | |
|---|---|---|---|---|---|---|---|
| 000011100 | 000011101 | 001011100 | 001110000 | 001110001 | 001110010 | 001110100 | 001110101 |
| 001110110 | 010011100 | 010011101 | 011011100 | 100011100 | 100011101 | 101011100 | 101110000 |
| 101110001 | 101110010 | 110011100 | 110011101 | | | | |

TABLE 7

Phase 1 code words

| | | | | | | | |
|---|---|---|---|---|---|---|---|
| 000001110 | 000111000 | 000111001 | 000111010 | 001001110 | 010001110 | 010111000 | 010111001 |
| 011001110 | 011100000 | 011100001 | 011100010 | 011100100 | 011100101 | 011100110 | 100001110 |
| 100111000 | 100111001 | 100111010 | 101001110 | 110001110 | 110111000 | 110111001 | |

TABLE 8

Unused but available Phase 0 and Phase 1 code words

| | | | | | | | |
|---|---|---|---|---|---|---|---|
| 000000001 | 000000010 | 000000100 | 000000101 | 000000110 | 001000000 | 010000000 | 011000000 |
| 100000000 | 101000000 | 110000000 | | | | | |

The Phase 1 code listed above provides a reduction in the maximum run length of consecutive NRZI zeros compared to prior art rate 8/9 codes that limited tribit locations. In particular, the Phase 1 code provides a maximum run length of 10 consecutive zeros compared to a maximum run length of 11 consecutive zeros in the prior art. In addition, the Phase 1 code eliminates all code words that consist of a single transition whereas 8/9 codes of the prior art included code words with a single transition.

Appendix A includes a description of an encoder capable of producing the Phase 0 and Phase 1 codes listed above. The encoder is described using a high level logic description language known as VHDL. This generic listing is used to synthesize the encoder in various vendor technologies using commonly available tools. Appendix B includes a VHDL description of a Phase 0/ Phase 1 decoder under the present invention.

In other embodiments of the present invention, a rate 9/10 code is formed using the tribit partitioning method described above. To construct the code, the following constraints are imposed on each ten bit NRZI code word having a bit layout $\{u_9 u_8 u_7 u_6 u_5 u_4 u_3 u_2 u_1 u_0\}$: reject any such sequence containing $$u_9 u_8 = 11 \tag{i}$$

or $$u_2 u_1 u_0 = 111. \tag{ii}$$

Reject any such sequence containing $$u_4 u_3 u_2 u_1 = 1111 \tag{iii}$$

or $$u_5 u_4 u_3 u_2 = 1111 \tag{iv}$$

or $$u_6 u_5 u_4 u_3 = 1111 \tag{v}$$

or $$u_7 u_6 u_5 u_4 = 1111 \tag{vi}$$

or $$u_8 u_7 u_6 u_5 = 1111 \tag{vii}$$

to eliminate quadbits.

Reject, though an optional choice, the sequence containing $$u_9 u_8 u_7 u_6 u_5 u_4 u_3 u_2 u_1 u_0 = 0000000000 \tag{viii}$$

to prevent an all zeroes code word.

Reject, though again an optional choice, the sequences containing $$u_9 u_8 u_7 u_6 u_5 u_4 u_3 u_2 u_1 u_0 = 0110011001 \tag{ix}$$

or $$u_9 u_8 u_7 u_6 u_5 u_4 u_3 u_2 u_1 u_0 = 1001100110 \tag{x}$$

to prevent quasi-catastrophic code words.

Reject any such sequence containing $$u_8 u_7 u_6 u_4 = 1110 \tag{xi}$$

or $$u8u6u5u4 = 0111 \tag{xii}$$

or $$u_6 u_5 u_4 u_2 = 1110 \tag{xiii}$$

or $$u_6u_4u_3u_2=0111 \quad \text{(xiv)}$$

or $$u_4u_3u_2u_0=1110 \quad \text{(xvi)}$$

to eliminate code words having tribits beginning at even numbered digit positions without the added "10" or "01" subsequences. Thus, tribits may begin in a code word at odd numbered digit positions, or alternatively at even numbered digit positions but only with the appropriate added bit structures.

Table 9 is a list of 512 available code words to form the rate 9/10 code under the present invention. By utilizing some of the tribits that begin at odd bit locations, the present invention is able to provide enough code words to uniquely represent each possible data word. Prior art methods of avoiding tribit errors did not leave enough code words to permit a rate 9/10 code.

TABLE 9

| | | | | | | | |
|---|---|---|---|---|---|---|---|
| 000000001 | 000000010 | 000000011 | 000000100 | 000000101 | 000000110 | 000001000 | 000001001 |
| 000001010 | 000001011 | 000001100 | 000001101 | 000001110 | 000010000 | 000010001 | 000010010 |
| 000010011 | 000010100 | 000010101 | 000010110 | 000011000 | 000011001 | 000011010 | 000011011 |
| 000100000 | 000100001 | 000100010 | 000100011 | 000100100 | 000100101 | 000100110 | 000101000 |
| 000101001 | 000101010 | 000101011 | 000101100 | 000101101 | 000101110 | 000110000 | 000110001 |
| 000110010 | 000110011 | 000110100 | 000110101 | 000110110 | 000111000 | 000111001 | 000111010 |
| 000111011 | 001000000 | 001000001 | 001000010 | 001000011 | 001000100 | 001000101 | 001000110 |
| 001001000 | 001001001 | 001001010 | 001001011 | 001001100 | 001001101 | 001001110 | 001010000 |
| 001010001 | 001010010 | 001010011 | 001010100 | 001010101 | 001010110 | 001011000 | 001011001 |
| 001011010 | 001011011 | 001011101 | 001100000 | 001100001 | 001100010 | 001100011 | 001100100 |
| 001100101 | 001100110 | 001101000 | 001101001 | 001101010 | 001101011 | 001101100 | 001101101 |
| 001101110 | 010000000 | 010000001 | 010000010 | 010000011 | 010000100 | 010000101 | 010000110 |
| 010001000 | 010001001 | 010001010 | 010001011 | 010001100 | 010001101 | 010001110 | 010010000 |
| 010010001 | 010010010 | 010010011 | 010010100 | 010010101 | 010010110 | 010011000 | 010011001 |
| 010011010 | 010011011 | 010100000 | 010100001 | 010100010 | 010100011 | 010100100 | 010100101 |
| 010100110 | 010101000 | 010101001 | 010101010 | 010101011 | 010101100 | 010101101 | 010101110 |
| 010110000 | 010110001 | 010110010 | 010110011 | 010110100 | 010110101 | 010110110 | 010111000 |
| 010111001 | 010111010 | 010111011 | 011000000 | 011000001 | 011000010 | 011000011 | 011000100 |
| 011000101 | 011000110 | 011001000 | 011001001 | 011001010 | 011001011 | 011001100 | 011001101 |
| 011001110 | 011010000 | 011010001 | 011010010 | 011010011 | 011010100 | 011010101 | 011010110 |
| 011011000 | 011011001 | 011011010 | 011011011 | 011011101 | 011100000 | 011100001 | 011100010 |
| 011100011 | 011100100 | 011100101 | 011100110 | 011101000 | 011101001 | 011101010 | 011101011 |
| 011101100 | 011101101 | 011101110 | 100000000 | 100000001 | 100000010 | 100000011 | 100000100 |
| 100000101 | 100000110 | 100001000 | 100001001 | 100001010 | 100001011 | 100001100 | 100001101 |
| 100001110 | 100010000 | 100010001 | 100010010 | 100010011 | 100010100 | 100010101 | 100010110 |
| 100011000 | 100011001 | 100011010 | 100011011 | 100100000 | 100100001 | 100100010 | 100100011 |
| 100100100 | 100100101 | 100100110 | 100101000 | 100101001 | 100101010 | 100101011 | 100101100 |
| 100101101 | 100101110 | 100110000 | 100110001 | 100110010 | 100110011 | 100110100 | 100110101 |
| 100110110 | 100111000 | 100111001 | 100111010 | 100111011 | 101000000 | 101000001 | 101000010 |
| 101000011 | 101000100 | 101000101 | 101000110 | 101001000 | 101001001 | 101001010 | 101001011 |
| 101001100 | 101001101 | 101001110 | 101010000 | 101010001 | 101010010 | 101010011 | 101010100 |
| 101010101 | 101010110 | 101011000 | 101011001 | 101011010 | 101011011 | 101011101 | 101100000 |
| 101100001 | 101100010 | 101100011 | 101100100 | 101100101 | 101100110 | 101101000 | 101101001 |
| 101101010 | 101101011 | 101101100 | 101101101 | 101101110 | 101110100 | 101110101 | 101110110 |
| 110000000 | 110000001 | 110000010 | 110000011 | 110000100 | 110000101 | 110000110 | 110001000 |
| 110001001 | 110001010 | 110001011 | 110001100 | 110001101 | 110001110 | 110010000 | 110010001 |
| 110010010 | 110010011 | 110010100 | 110010101 | 110010110 | 110011000 | 110011010 | 110011011 |
| 110100000 | 110100001 | 110100010 | 110100011 | 110100100 | 110100101 | 110100110 | 110101000 |
| 110101001 | 110101010 | 110101011 | 110101100 | 110101101 | 110101110 | 110110000 | 110110001 |
| 110110010 | 110110011 | 110110100 | 110110101 | 110110110 | 110111000 | 110111001 | 110111010 |
| 110111011 | 111010000 | 111010001 | 111010010 | 111010011 | 111010100 | 111010101 | 111010110 |
| 111011000 | 111011001 | 111011010 | 111011011 | 111011101 | 000000000 | 000000001 | 000000010 |
| 000000011 | 000000100 | 000000101 | 000000110 | 000001000 | 000001001 | 000001010 | 000001011 |
| 000001100 | 000001101 | 000001110 | 000010000 | 000010001 | 000010010 | 000010011 | 000010100 |
| 000010101 | 000010110 | 000011000 | 000011001 | 000011010 | 000011011 | 000100000 | 000100001 |
| 000100010 | 000100011 | 000100100 | 000100101 | 000100110 | 000101000 | 000101001 | 000101010 |
| 000101011 | 000101100 | 000101101 | 000101110 | 000110000 | 000110001 | 000110010 | 000110011 |
| 000110100 | 000110101 | 000110110 | 000111000 | 000111001 | 000111010 | 000111011 | 001000000 |
| 001000001 | 001000010 | 001000011 | 001000100 | 001000101 | 001000110 | 001001000 | 001001001 |
| 001001010 | 001001011 | 001001100 | 001001101 | 001001110 | 001010000 | 001010001 | 001010010 |
| 001010011 | 001010100 | 001010101 | 001010110 | 001011000 | 001011001 | 001011010 | 001011011 |
| 001011101 | 001100000 | 001100001 | 001100010 | 001100011 | 001100100 | 001100101 | 001101000 |
| 001101001 | 001101010 | 001101011 | 001101101 | 001101101 | 001101110 | 010000000 | 010000001 |
| 010000010 | 010000011 | 010000100 | 010000101 | 010000110 | 010001000 | 010001001 | 010001010 |
| 010001011 | 010001100 | 010001101 | 010001110 | 010010000 | 010010001 | 010010010 | 010010011 |
| 010010100 | 010010101 | 010010110 | 010011000 | 010011001 | 010011010 | 010011011 | 010100000 |
| 010100001 | 010100010 | 010100011 | 010100100 | 010100101 | 010100110 | 010101000 | 010101001 |
| 010101010 | 010101011 | 010101100 | 010101101 | 010101110 | 010110000 | 010110001 | 010110010 |
| 010110011 | 010110100 | 010110101 | 010110110 | 010111000 | 010111001 | 010111010 | 010111011 |
| 011000000 | 011000001 | 011000010 | 011000011 | 011000100 | 011000101 | 011000110 | 011001000 |
| 011001001 | 011001010 | 011001011 | 011001100 | 011001101 | 011001110 | 011010000 | 011010001 |
| 011010010 | 011010011 | 011010100 | 011010101 | 011010110 | 011011000 | 011011001 | 011011010 |
| 011011011 | 011011101 | 011100000 | 011100001 | 011100010 | 011100011 | 011100100 | 011100101 |
| 011100110 | 011101000 | 011101001 | 011101010 | 011101011 | 011101100 | 011101101 | 011101110 |

In addition to the codes themselves, aspects of the present invention include the design of the detectors used to detect code words in the channel output. The design of these detectors is based in part on the partial response characteristics of the channel. In particular, a different detector design is needed for an EPR4 channel than an $E^2$PR4 channel.

Figure 4:
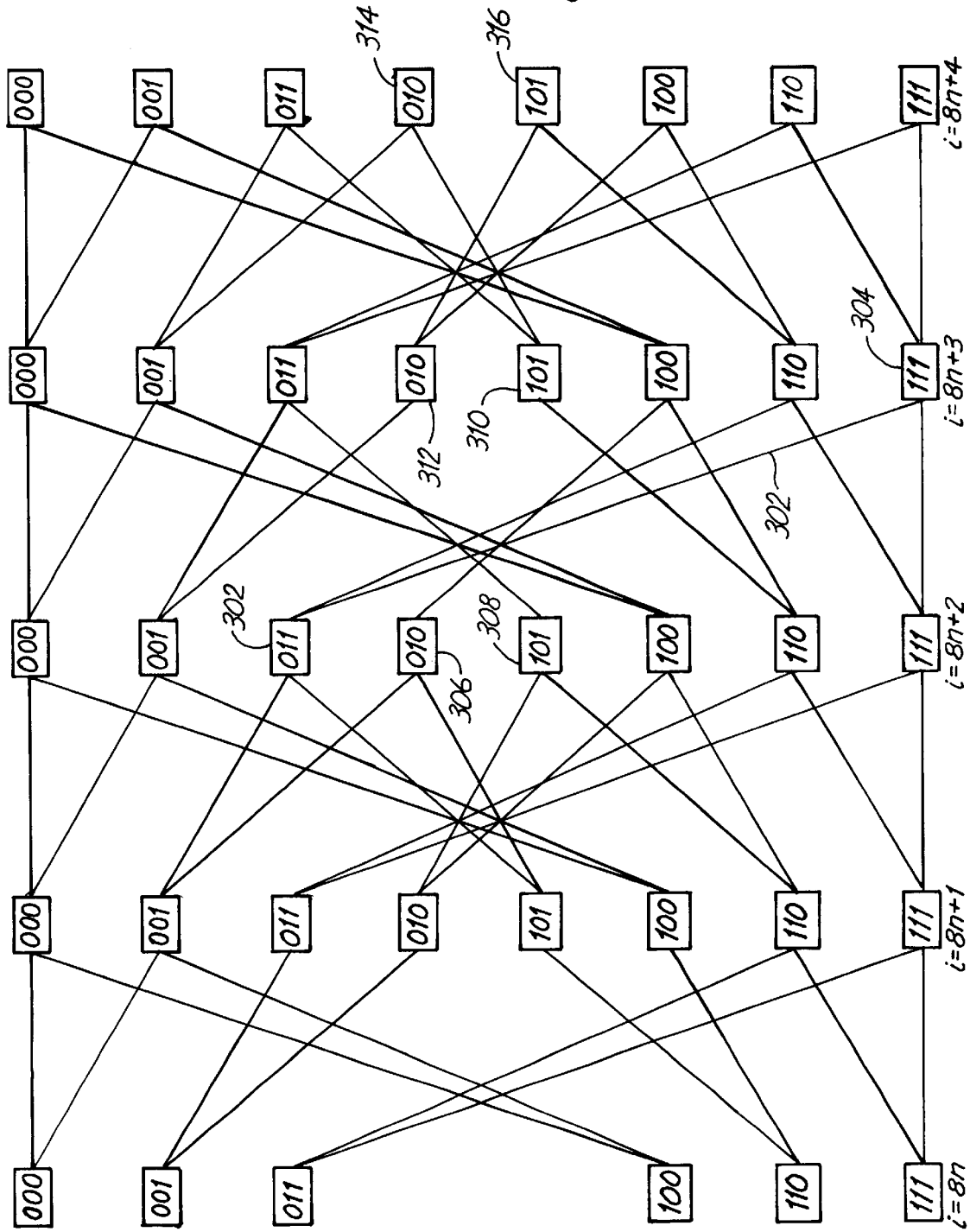
FIGS. 4 and 5 are separate portions of a trellis diagram describing one embodiment of a radix 2, EPR4 channel detector for detecting one embodiment of a 7/8 code of the present invention.
Figure 5:
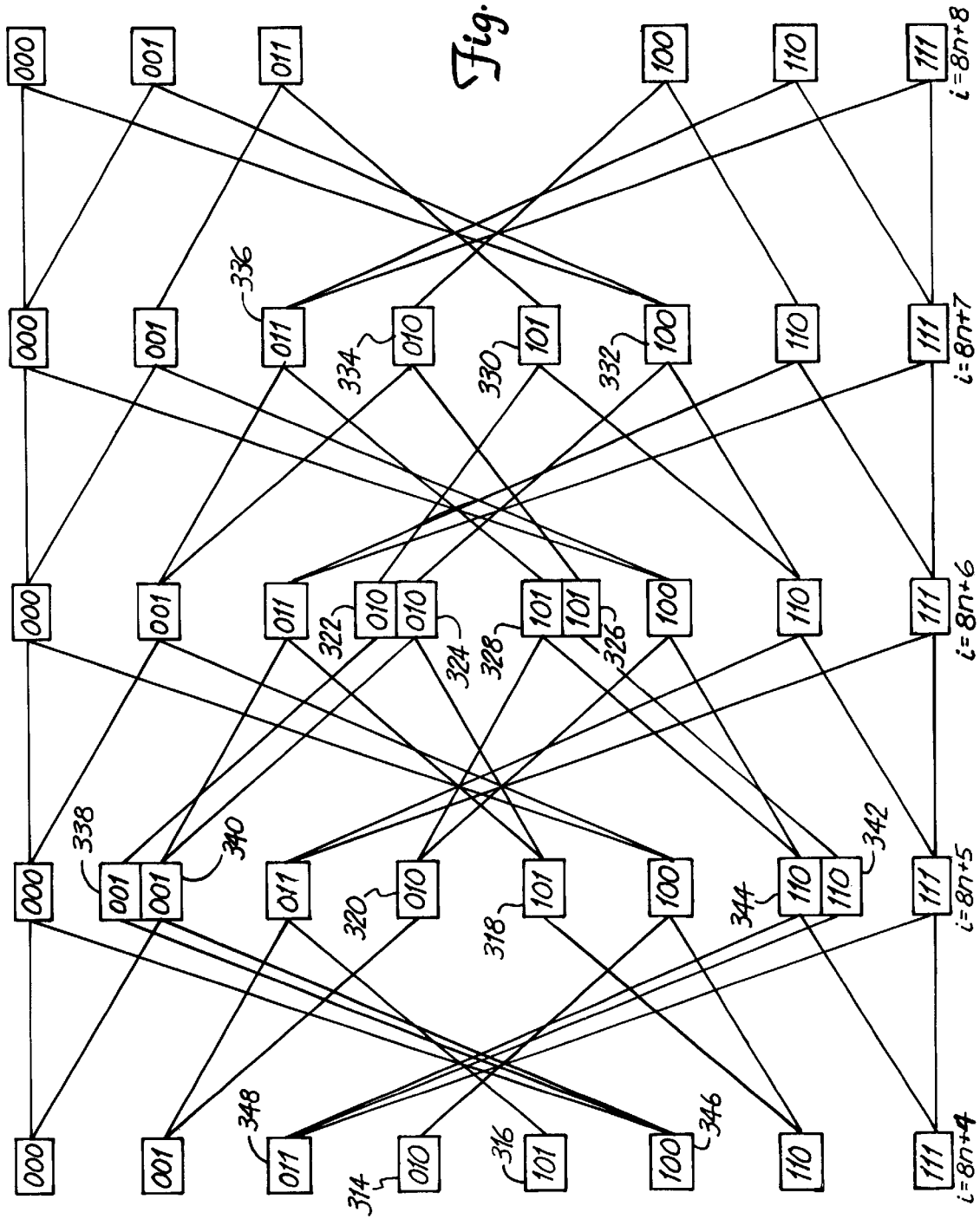

EPR4 detectors under the present invention typically employ decision feedback or state splitting because the allowance of a tribit at a particular location is determined in part by the bits that proceed the tribit. FIGS. 4 and 5 show a trellis diagram associated with an EPR4 detector for the 7/8 code of Table 3. FIG. 4 shows the first four bits of an 8-bit code block and FIG. 5 shows the last four bits of the 8-bit code block. At each time period associated with each respective bit, the detector may be in one of a plurality of states. In FIGS. 4 and 5, each state is shown as a box containing the last three detected NRZ values, and the time periods are referenced by their absolute bit position, i, defined as 8 times the number of previous code words, n, plus the bit position in the current code word. For example state 300 is at time period 8n+2 and contains NRZ values 011. Allowed transitions between states are shown as directed edges connecting the states, such as directed edge 302, which connects state 300 and state 304. A sequence of contiguous directed edges from the beginning to the end of a possible sequence is referred to as a path through the trellis diagram.

To determine the most likely path, and thus the most likely sequence, the detector determines a path metric that represents the combined probability of a sequence given the samples read from the channel. By selecting only the most probable path into each state, the Viterbi algorithm causes the paths to merge toward a single most probable path.

To enforce the code word boundary constraints of the 7/8 code of Table 3, states with NRZ values of 010 and 101 are removed from the first time period of FIG. 4 and the last time period of FIG. 5. In addition, to eliminate tribits at the beginning of a code word, the detector forbids transitions from states 306 (NRZ 010) and 308 (NRZ 101) of time period 8n+2 to states 310 (NRZ 101) and 312 (NRZ 010), respectively, of time period 8n+3. To enforce other tribit restrictions, the detector forbids transitions from 8n+4 states 314 (NRZ 010) and 316 (NRZ 101) to 8 n+5 states 318 (NRZ 101) and 320 (NRZ 010), respectively. By removing these transitions, the detector eliminates code words having the form X01110XX from consideration.

To allow code words of the form XX101110 while removing code words of the form XX001110, the detector of FIG. 5 uses a set of split states during time periods 8n+5 and 8n+6. Specifically, at time 8n+6, two split states 322 and 324 each represent NRZ 010 and two split states 326 and 328 each represent NRZ 101. For NRZ 010, a transition extends from state 322 to state 330 (NRZ 101) of time 8n+7 and a separate transition extends from state 324 to state 332 (NRZ 100). The path between state 322 and state 330 represents an NRZI tribit while the path between state 324 and 332 represents an NRZI sequence of "110". Similarly, a transition representing a tribit extends from split state 326 (NRZ 101) of time 8n+6 to state 334 (NRZ 010) and a transition representing an NRZI sequence "110" extends from split state 328 (NRZ 101) to state 336 (NRZ 011). Since the existence of a tribit is determined by which of the two split states the detector enters at time 8n+6, the detector can control the existence of a tribit by controlling which of the two split states it enters.

The detector limits entry into split states 322 and 326, which are associated with the NRZI tribit, by requiring a preceding NRZI "10". This is accomplished by limiting the transitions into split states 322 and 326 so that the states proceeding states 322 and 326 represent successive NRZ values of 100, 001 for state 322 and 011, 110 for state 326. To ensure that a state with a NRZ value of 001 is preceded by a state with a NRZ value of 100, the detector creates split states 338 and 340 to represent NRZ 001 at time 8n+5. Split state 338 is then set as the only state that transitions into state 322, and transitions into split state 338 are limited so that they only come from state 346 (NRZ 100) of time 8n+4. Thus, the only path into split state 322 involves a first transition from state 346 (NRZ 100) to state 338 (NRZ 001) and a second transition from state 338 to state 322. This ensures a previous NRZI sequence of "10" before state 322. A similar technique involving split states 342 and 344 at time 8n+5 and state 348 at time 8n+4 ensures and NRZI sequence of "10" before split state 326 of time 8n+6.

Thus, by using split states, the detector is able to allow code words of the form XX101110 while forbidding code words of the form XX001110. Note that since only one path enters each split state, the split states only need to store the sum of a state metric and a branch metric, but do not have the normal compare—select stages of a full add-compare-select state.

Figure 6:
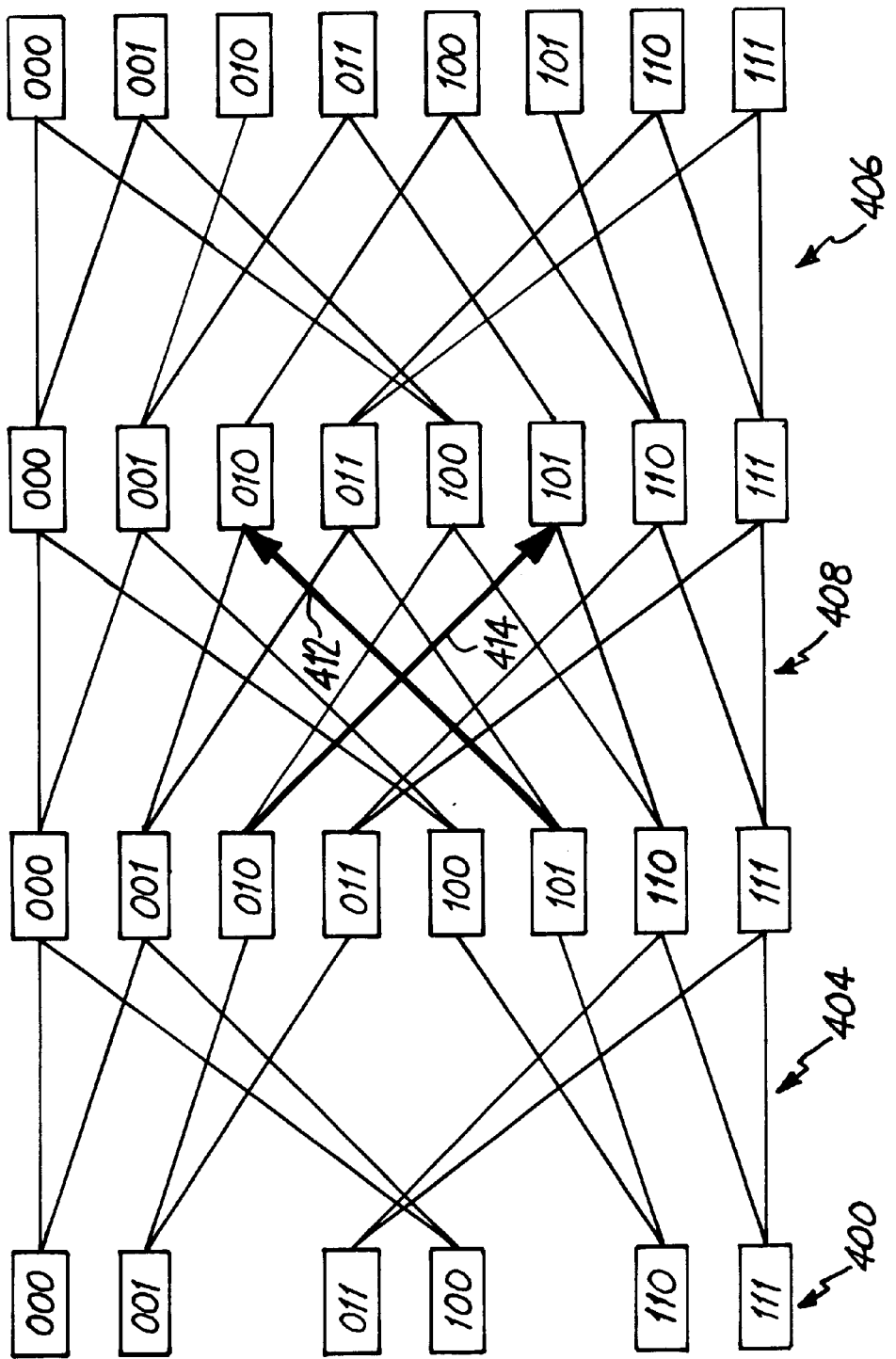
FIGS. 6, 7 and 8 are separate portions of a trellis diagram describing an embodiment of a radix 2, EPR4 channel detector for detecting one embodiment of a 8/9 code of the present invention.
Figure 7:
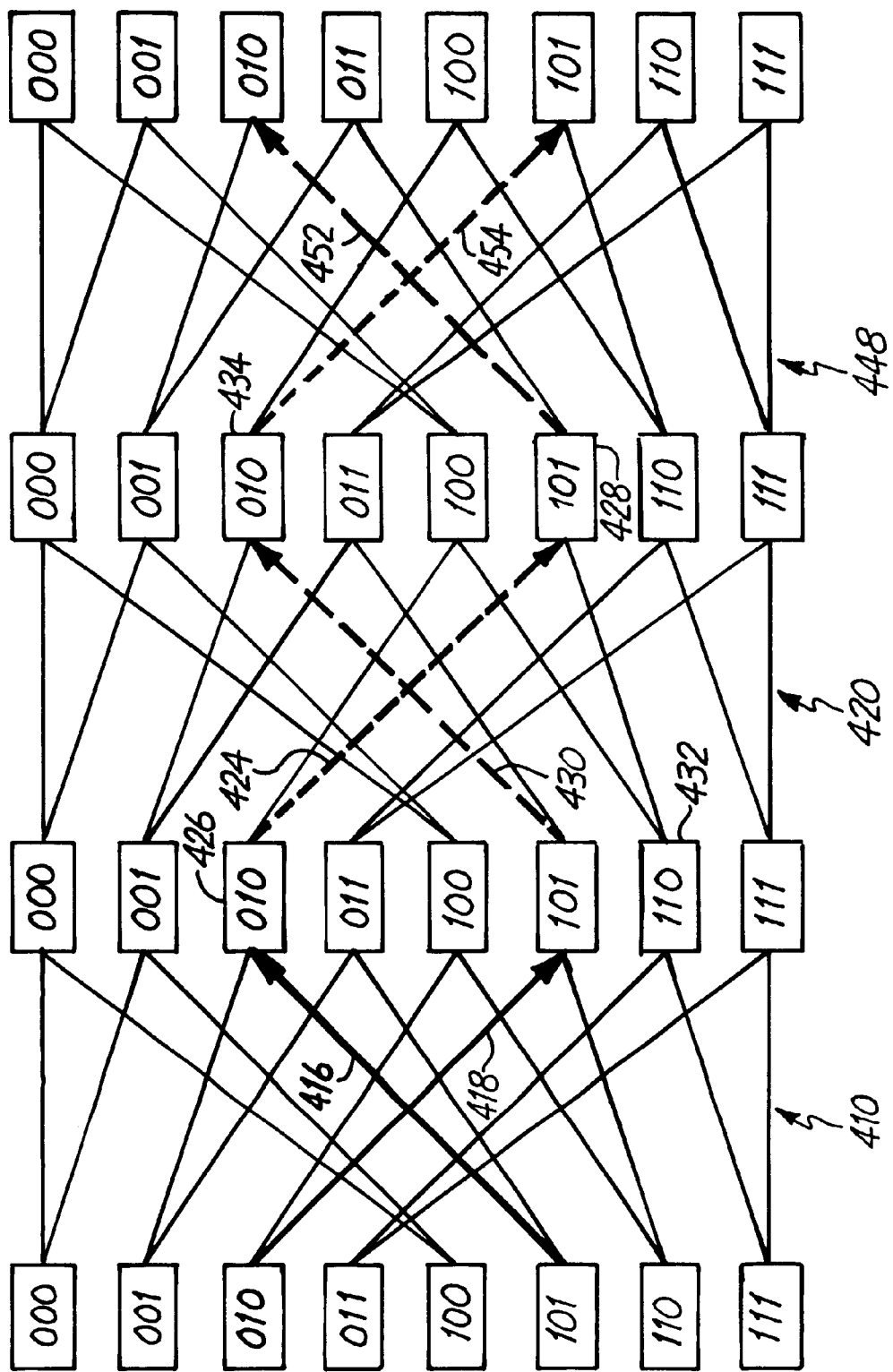
Figure 8:
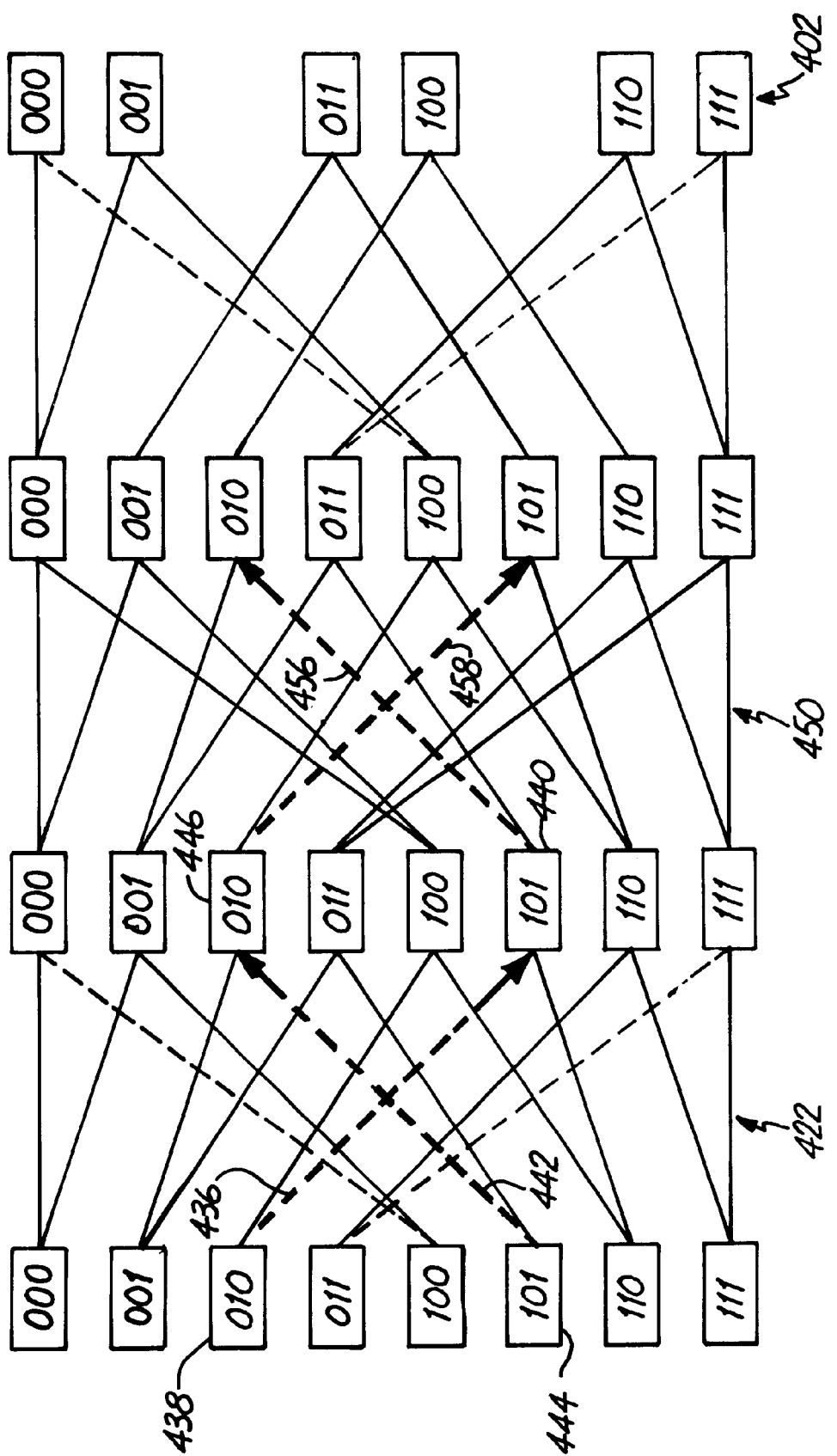

FIGS. 6, 7, and 8 show a trellis diagram for another embodiment of a detector under the present invention. The detector of FIGS. 6, 7, and 8 is associated with the rate 8/9 code of Tables 4, 5, 6, and 7 above when that code is used with an EPR4 channel.

To impose the code word boundary constraints of having fewer than two transitions at the beginning or end of a code word, the detector of FIGS. 6, 7, and 8, removes states corresponding to NRZ 010 and 101 from the first time period 400 and the last time period 402 of each code word.

In FIGS. 6, 7, and 8, the ending edges of a tribit occur as a transition from states corresponding to NRZ 010 (101) to states corresponding to NRZ 101 (010). Since tribits cannot end on the first bit 404 or third bit 406 of a 9-bit block under the code constraints of the present embodiment, these transitions are removed from the detector at those bit positions as shown in FIG. 6. Tribits are freely allowed to end at second bit 408 and fourth bit 410 as shown by the bold arrows of transitions 412, 414, 416, and 418 of FIGS. 6 and 7.

Under the present partitioning strategy, tribits are allowed to end at the fifth bit 420 and the seventh bit 422 only if the last bit in the tribit sequence is preceded by "1011" NRZI. Thus, at fifth bit 420, there is one conditional transition 424 from state 426 (NRZ 010) to state 428 (NRZ 101) and a second conditional transition 430 from state 432 (NRZ 101) to state 434 (NRZ 010). Likewise, at seventh bit 422 there is one conditional transition 436 from state 438 (NRZ 010) to state 440 (NRZ 101) and a second conditional transition 442 from state 444 (NRZ 101) to state 446 (NRZ 010). To determine if the conditional transitions are to be retained or removed for a particular path, the detector examines the previous history of each path leading up to the conditional transition. For example, to determine if conditional transition 424 is to be retained as a possible branch for a path that enters state 426, the detector examines the past history of the path to determine if it ends in an NRZI sequence of 1011. If the past history indicates a preceding 1011, this information is fed back and the conditional transition is allowed. If the past history does not indicate a preceding 1011, the conditional transition is forbidden.

Sixth bit 448 and eighth bit 450 also contain two conditional transitions each, transitions 452 and 454 at sixth bit 448 and transitions 456 and 458 at eighth bit 450. Although tribits are freely allowed to end at these bit positions, the transitions are conditional because they may result in a forbidden quadbit. Thus, the path histories are examined to determine if these transitions are preceded by an NRZI tribit. If so, the transitions are eliminated. If not, the transitions are allowed.

Figure 9:
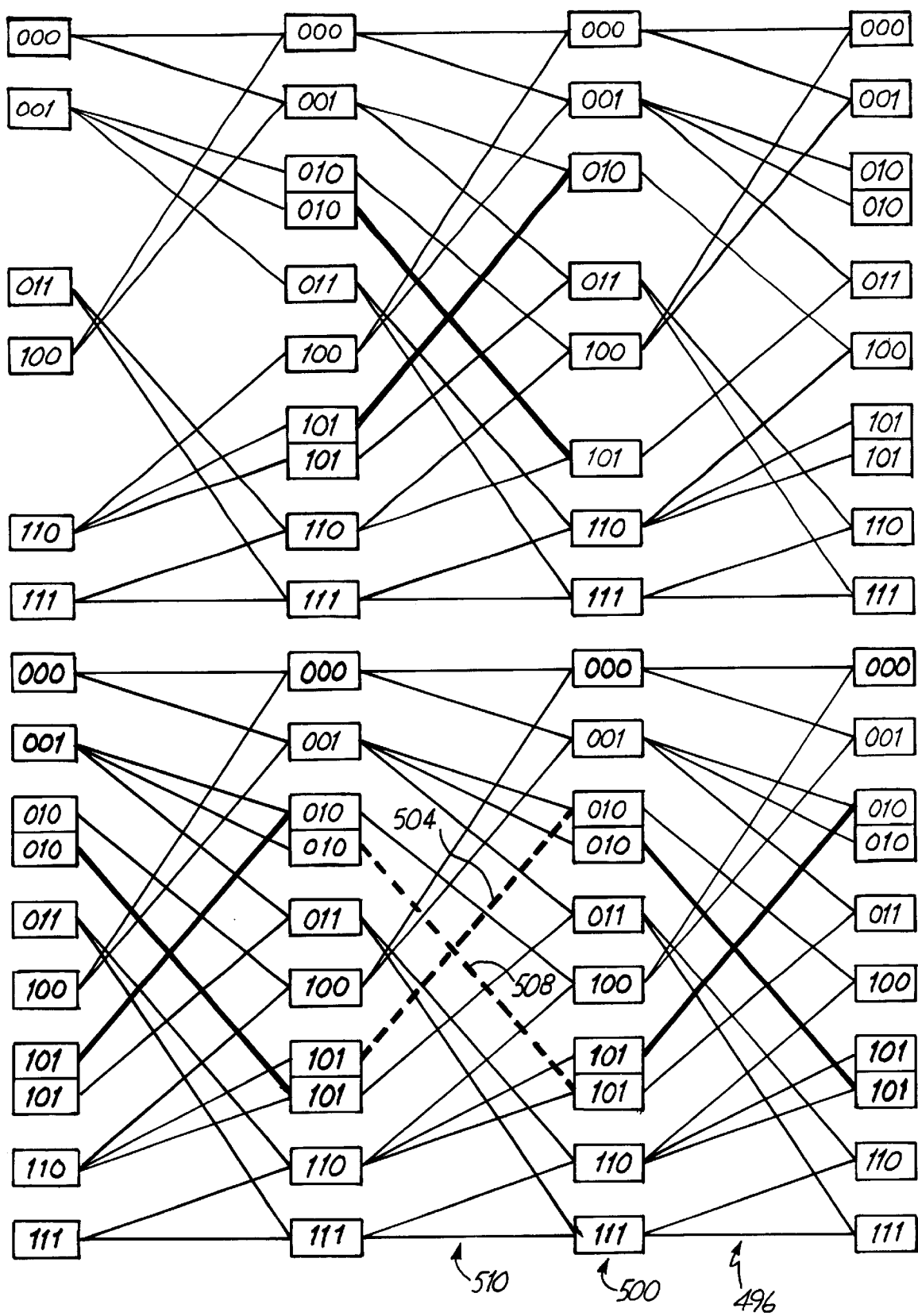
FIGS. 9 and 10 show portions of a trellis diagram describing a second embodiment of a radix 2, EPR4 channel detector for detecting one embodiment of a 8/9 code of the present invention.
Figure 10:
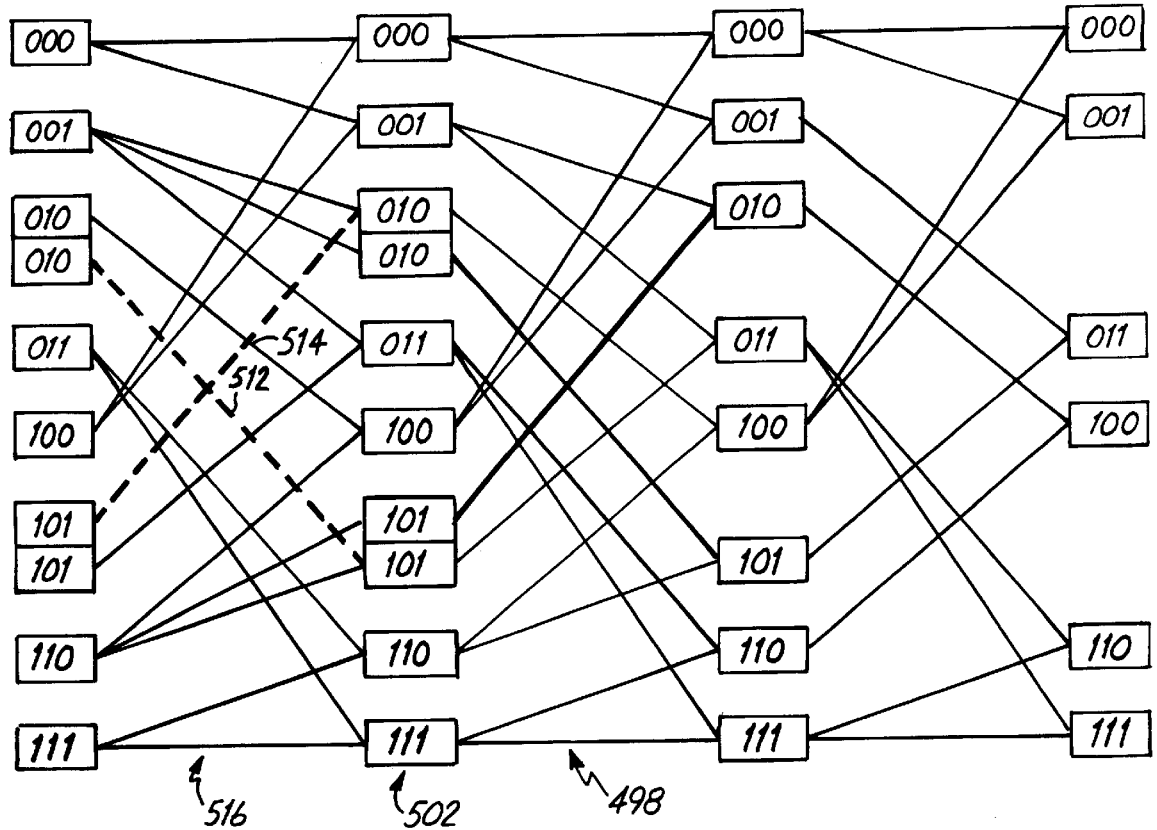

The operation of a second embodiment of an EPR4, 8/9 detector for the code of the present invention is shown in the trellis diagram of FIGS. 9 and 10. The detector of FIGS. 9 and 10 uses a combination of split states and decision feedback to eliminate quadbits and to enforce the partitioning of tribits discussed above.

To eliminate quadbits at sixth bit 496 and eighth bit 498, the detector uses split states corresponding to NRZ values 010 and 101 before the sixth and eighth bits at time periods 500 and 502. Only one of the split states for each value has a transition in the sixth or eighth bit corresponding to an NRZI 1. The only path into the split state corresponding to the NRZI 1 transition is from a state corresponding to a path history of NRZI "01". Thus, at the sixth and eighth bits there are at most two consecutive NRZI 1's.

The detector also uses decision feedback to implement the tribit partitioning discussed above. In particular, the detector uses conditional transitions 504 and 508 at fifth bit 510, and conditional transitions 512 and 514 at seventh bit 516 to implement the tribit partitioning. To determine whether to retain these conditional transitions as viable branches for a particular path, the detector examines the history of the path to determine if it contains a 1011 NRZI history. If it does, the conditional transition is a viable branch. If it does not, the conditional transition is not considered for the current path. Note that because of the use of split states, the decision not to use a conditional transition terminates the path.

In one embodiment, a special decoder rule is combined with the detector of FIGS. 9 and 10 to prevent shifted tribit errors. In particular, the detector is allowed to detect non-code word sequences of the form 1011100XX even though these non-code word sequences may be formed in the channel through a shifted tribit error of valid code word sequences, notably sequences of the form 1001110XX. To prevent these non-code word sequences from creating an error, the decoder is designed to decode these non-code word sequences to the same data words as the valid code word sequences. Thus, the non-code word 101110010 would be decoded to the same data word as the valid code word 100111010.

Other embodiments of the present invention utilize a radix 4 detector, which operates on successive pairs of consecutive channel output samples. In most embodiments, such detectors are used with an $E^2PR4$ channel such that the detector has sixteen states at each time period with each state being described by the past four NRZ channel output bits. For a radix 4 detector, transitions between states involve the detection of two new NRZI bits, with the combination of states involved in the transition describing a total of five NRZI bits. For example, if state 1 is described by NRZ bits ABCD and state 2 is described by NRZ bits CDEF, the combination of state 1 and state 2 forms ABCDEF, which defines NRZI bits A⊕B, B⊕C, C⊕D, D⊕E, and E⊕F, where ⊕ is an EXCLUSIVE-OR operation. A series of state transitions therefore corresponds to a series of observations by the detector of the last five bits in NRZI coded format corresponding to each transition.

This property can be exploited to design radix four detectors for $E^2PR4$ channels so that undesired sequences are rejected without incorporating additional trellis states or decision feedback as found above for the EPR4 detectors. Typically, the design of such detectors is based on a time—varying but periodic trellis structure, such that a counter with the desired period and logic is able to remove unwanted edges in a trellis without reference to past path histories.

One embodiment of a radix 4 detector for an $E^2PR4$ channel under the present invention is used to detect the 7/8 code of table 3 above. The detector is phased to receive channel output bits, $x_y$, grouped together in states as follows:

$$\ldots x_6 x_5 x_4 x_3 \; x_4 x_3 x_2 x_1 x_2 x_1 x_0 x_7' x_0 x_7' x_6' x_5' \ldots$$

where $x_6 x_5 x_4 x_3$ indicates the sixth, fifth, fourth and third NRZ bits associated with a code word, the prime marks designate bits in the next cycle of code word bits and the arrows designate transitions. Each code word in NRZI format is thus described generically as $\{u_7 u_6 u_5 u_4 u_3 u_2 u_1 u_0\}$ where $u_y = x_{y+1} \oplus x_y$.

As mentioned above, during a transition, the detector has access to five NRZI bits of the codeword. For example, when examining the transition between the state containing $x_6 x_5 x_4 x_3$ and the state containing $x_4 x_3 x_2 x_1$, the detector has direct access to the code word subsequence $u_5 u_4 u_3 u_2 u_1$. In fact, with this phasing, each code word is associated with are four transitions, which provide access to code word subsequences of:

$u_7 u_6 u_5 u_4 u_3$, $u_5 u_4 u_3 u_2 u_1$, $u_3 u_2 u_1 u_0 u'_7$, and $u_1 u_0 u'_7 u'_6 u'_5$ By being able to access these subsequences, the detector of the present invention is able to perform the following detection functions without using decision feedback or state splitting: reject any sequences containing $$u_2 u_1 u_0 = 111 \tag{i}$$

or $$u_7 u_6 = 11 \tag{ii}$$

to enforce the code word boundary constraints;
reject any sequences containing $$u_4 u_3 u_2 u_1 = 1111 \tag{iii}$$

or $$u_5 u_4 u_3 u_2 = 1111 \tag{iv}$$

or $$u_6 u_5 u_4 u_3 = 1111 \tag{v}$$

to eliminate quadbits;
reject, through an optional choice, the sequence containing $$u_7 u_6 u_5 u_4 u_3 u_2 u_1 u_0 = 00000000 \tag{viii}$$

to prevent an all zeroes code word;
reject, though an optional choice, the sequences containing $$u_7 u_6 u_5 u_4 u_3 u_2 u_1 u_0 = 10011001 \tag{ix}$$

or $$u_7 u_6 u_5 u_4 u_3 u_2 u_1 u_0 = 01100110 \tag{x}$$

to prevent quasi-catastrophic code words; and
reject sequences containing $$u_7 u_5 u_4 u_3 = 0111 \tag{xi}$$

or $$u_5u_3u_2u_1 = 0111 \quad (xii)$$

to eliminate code words having tribits beginning at odd numbered digit positions if they are not preceded by an NRZI sequence of "10".

Because the code of Table 3 can be detected in a properly phased radix 4 detector without using decision feedback or state splitting it is referred to as a r4-compatible code. It should be noted that the 7/8 code of Table 4 is not r4-compatible because the sequences 101110XX and XX011101 of that code cannot both be detected on the same phase of a radix four $E^2PR4$ detector without additional circuit complexity. It should also be noted that the detector must be properly phased in order to detect the code of Table 3 without additional circuit complexity. Specifically, if the detector is phased with channel bits grouped in states as:

$$\ldots x_7x_6x_5x_4 \ x_5x_4x_3x_2 \ x_3x_2x_1x_0x_1x_0x_7'x_6' \ldots$$

additional feedback circuitry or state splitting must be added to the detector to detect the 7/8 code of Table 3.

A second embodiment of a radix 4, $E^2PR4$ channel detector under the present invention is designed to detect the rate 8/9 code of Tables 5, 6, 7 and 8 above. Because the are an odd number of bits in each code word for this code, neither the Phase 0 code nor the Phase 1 code of those tables are by themselves r4 compatible. However, by combining the Phase 0 code and Phase 1 code, it is possible to generate a r4-compatible code. In order to do this, the encoder must alternate between the Phase 0 code and the Phase 1 code. The detector is then phased to create states having NRZ bit groupings of:

$$\ldots x_8x_7x_6x_5 \ x_6x_5x_4x_3 \ x_4x_3x_2x_1x_2x_1x_0x_8'x_0x_8 \ 'x_7'x_6' \ldots$$

$$\ldots x_7'x_6 \ 'x_5 \ 'x_4 \ 'x_5 \ 'x_4'x_3'x_2'x_3'x_2'x_1'x_0'x_1'x_0'x_8''x_7'' \ldots$$

where no prime and double prime indicates channel bits associated with phase 0 and a single prime indicates channel bits associated with phase 1.

Since both the phase 0 code and the phase 1 code have the same code word boundary constraints and the same quadbit constraints, the constraints of interest in alternating between the two codes are the tribit constraints. Table 10 below summarizes the tribit constraints of each code. Specifically, in the first row of 1's and 0's, Table 10 indicates the positions where tribits are allowed without restriction at code word boundaries. The second and third rows indicate the even-bit positions where tribits are allowed without restriction in phase 0 code words, and the fourth through sixth rows indicate the odd-bit positions where tribits are allowed without restriction in phase 1 code words. The seventh, eighth and ninth rows show the odd-bit positions where tribits are allowed in the phase 0 code if the tribits are preceded by a "10" or followed by a "01". The tenth and eleventh rows show the even-bit positions where tribits are allowed in the phase 1 code if the tribits are preceded by a "10" or followed by a "01".

In addition, the twelfth row of Table 10 shows 9 modes of operation that the detector enters during the detection of 18 consecutive channel bits. Each mode is associated with a collection of allowed transitions for detecting pairs of code word bits. Each collection is indicated by a separate letter, and each collection is associated with the detection of two new code bits. For example, collection A is associated with the detection of code bits $e_8$ and $e_7$, and using the phasing shown above is associated with the transitions of:

$$x_3'x_2'x_1'x_0'x_1'x_0'x_8''x_7''$$

In Table 10, collections of transitions that are the same for different pairs of code bits are given the same letter. Thus, the same collection of transitions, C, is used during the detection of code bit pair $e_4,e_3$ and code bit pair $e_2,e_1$.

TABLE 10

| Phase 0 | | | | | | | | | Phase 1 | | | | | | | | |
|---|---|---|---|---|---|---|---|---|---|---|---|---|---|---|---|---|---|
| $e_8$ | $e_7$ | $e_6$ | $e_5$ | $e_4$ | $e_3$ | $e_2$ | $e_1$ | $e_0$ | $o_8$ | $o_7$ | $o_6$ | $o_5$ | $o_4$ | $o_3$ | $o_2$ | $o_1$ | $o_0$ |
| 1 | 1 | 0 | | | | | 0 | 1 | 1 | 1 | 0 | | | | | 0 | 1 |
| | 0 | 1 | 1 | 1 | 0 | | | | | | | | | | | | |
| | | 0 | 1 | 1 | 1 | 0 | | | | | | | | | | | |
| | | | | | | | | | 0 | 1 | 1 | 1 | 0 | | | | |
| | | | | | | | | | | 0 | 1 | 1 | 1 | 0 | | | |
| | | | | | | | | | | | 0 | 1 | 1 | 1 | 0 | | |
| 0 | 1 | 1 | 1 | 0 | 1 | | | | | | | | | | | | |
| | 1 | 0 | 1 | 1 | 1 | 0 | 1 | | | | | | | | | | |
| | | 1 | 0 | 1 | 1 | 1 | 0 | | | | | | | | | | |
| | | | | | | | | | 1 | 0 | 1 | 1 | 1 | 0 | 1 | | |
| | | | | | | | | | | 1 | 0 | 1 | 1 | 1 | 0 | 1 | |
| A | | B | | C | | C | | D | | E | | C | | C | | F | |

The valid transitions of collections A, B, C, D, E, and F found in Table 10 are listed below in Tables 12, 13, 14, 15, 16, and 17, respectively. In these tables, each allowed transition is represented by the NRZ values associated with a current state, an arrow, and the NRZ values associated with a next state. Forbidden transitions are not shown in a collection. For example, in collection A of Table 12 the transition from state 0010 to state 0000 does not appear because it is not permitted at that stage of the detector. The representation of the detector in Tables 11, 12, 13, 14, 15, 16, and 17 is provided instead of a trellis diagram because a trellis diagram would be too cumbersome to easily understand.

TABLE 12

Transition collection A

| | | | |
|---|---|---|---|
| 0000 → 0000 | 0100 → 0000 | 1000 → 0000 | 1100 → 0000 |
| 0000 → 0001 | 0100 → 0001 | 1000 → 0001 | 1100 → 0001 |
| 0000 → 0010 | 0100 → 0010 | 1000 → 0010 | 1100 → 0010 |
| 0000 → 0011 | 0100 → 0011 | 1000 → 0011 | 1100 → 0011 |
| 0001 → 0100 | | 1001 → 0100 | |
| 0001 → 0101 | | 1001 → 0101 | |
| 0001 → 0110 | | 1001 → 0110 | |

TABLE 12-continued

Transition collection A

| | | | |
|---|---|---|---|
| 0001 → 0111 | | 1001 → 0111 | |
| | | 0110 → 1000 | 1110 → 1000 |
| | 0110 → 1001 | | 1110 → 1001 |
| | 0110 → 1010 | | 1110 → 1010 |
| | 0110 → 1011 | | 1110 → 1011 |
| 0011 → 1100 | 0111 → 1100 | 1011 → 1100 | 1111 → 1100 |
| 0011 → 1101 | 0111 → 1101 | 1011 → 1101 | 1111 → 1101 |
| 0011 → 1110 | 0111 → 1110 | 1011 → 1110 | 1111 → 1110 |
| 0011 → 1111 | 0111 → 1111 | 1011 → 1111 | 1111 → 1111 |

(total 2 bit transitions = 48)

TABLE 13

Transition Collection B

| | | | |
|---|---|---|---|
| 0000 → 0000 | 0100 → 0000 | 1000 → 0000 | 1100 → 0000 |
| 0000 → 0001 | 0100 → 0001 | 1000 → 0001 | 1100 → 0001 |
| 0000 → 0010 | 0100 → 0010 | 1000 → 0010 | 1100 → 0010 |
| 0000 → 0011 | 0100 → 0011 | 1000 → 0011 | 1100 → 0011 |
| 0001 → 0100 | | 1001 → 0100 | |
| 0001 → 0101 | | 1001 → 0101 | |
| 0001 → 0110 | 0101 → 0110 | 1001 → 0110 | 1101 → 0110 |
| 0001 → 0111 | 0101 → 0111 | 1001 → 0111 | 1101 → 0111 |
| 0010 → 1000 | 0110 → 1000 | 1010 → 1000 | 1110 → 1000 |
| 0010 → 1001 | 0110 → 1001 | 1010 → 1001 | 1110 → 1001 |
| | 0110 → 1010 | | 1110 → 1010 |
| | 0110 → 1011 | | 1110 → 1011 |
| 0011 → 1100 | 0111 → 1100 | 1011 → 1100 | 1111 → 1100 |
| 0011 → 1101 | 0111 → 1101 | 1011 → 1101 | 1111 → 1101 |
| 0011 → 1110 | 0111 → 1110 | 1011 → 1110 | 1111 → 1110 |
| 0011 → 1111 | 0111 → 1111 | 1011 → 1111 | 1111 → 1111 |

(total 2 bit transitions = 56)

TABLE 14

Transition Collection C

| | | | |
|---|---|---|---|
| 0000 → 0000 | 0100 → 0000 | 1000 → 0000 | 1100 → 0000 |
| 0000 → 0001 | 0100 → 0001 | 1000 → 0001 | 1100 → 0001 |
| 0000 → 0010 | 0100 → 0010 | 1000 → 0010 | 1100 → 0010 |
| 0000 → 0011 | 0100 → 0011 | 1000 → 0011 | 1100 → 0011 |
| 0001 → 0100 | | 1001 → 0100 | 1101 → 0100 |
| | | 1001 → 0101 | |
| 0001 → 0110 | 0101 → 0110 | 1001 → 0110 | 1101 → 0110 |
| 0001 → 0111 | | 1001 → 0111 | 1101 → 0111 |
| 0010 → 1000 | 0110 → 1000 | | 1110 → 1000 |
| 0010 → 1001 | 0110 → 1001 | 1010 → 1001 | 1110 → 1001 |
| | 0110 → 1010 | | |
| 0010 → 1011 | 0110 → 1011 | | 1110 → 1011 |
| 0011 → 1100 | 0111 → 1100 | 1011 → 1100 | 1111 → 1100 |
| 0011 → 1101 | 0111 → 1101 | 1011 → 1101 | 1111 → 1101 |
| 0011 → 1110 | 0111 → 1110 | 1011 → 1110 | 1111 → 1110 |
| 0011 → 1111 | 0111 → 1111 | 1011 → 1111 | 1111 → 1111 |

(total 2 bit transitions = 54)

TABLE 15

Transition Collection D

| | | | |
|---|---|---|---|
| 0000 → 0000 | 0100 → 0000 | 1000 → 0000 | 1100 → 0000 |
| 0000 → 0001 | 0100 → 0001 | 1000 → 0001 | 1100 → 0001 |
| 0000 → 0010 | 0100 → 0010 | 1000 → 0010 | 1100 → 0010 |
| 0000 → 0011 | 0100 → 0011 | 1000 → 0011 | 1100 → 0011 |
| 0001 → 0110 | 0101 → 0110 | 1001 → 0110 | 1101 → 0110 |
| 0001 → 0111 | 0101 → 0111 | 1001 → 0111 | 1101 → 0111 |
| 0010 → 1000 | 0110 → 1000 | 1010 → 1000 | 1110 → 1000 |
| 0010 → 1001 | 0110 → 1001 | 1010 → 1001 | 1110 → 1001 |
| 0011 → 1100 | 0111 → 1100 | 1011 → 1100 | 1111 → 1100 |
| 0011 → 1101 | 0111 → 1101 | 1011 → 1101 | 1111 → 1101 |
| 0011 → 1110 | 0111 → 1110 | 1011 → 1110 | 1111 → 1110 |
| 0011 → 1111 | 0111 → 1111 | 1011 → 1111 | 1111 → 1111 |

(total 2 bit transitions = 48)

TABLE 16

Transition Collection E

| | | | |
|---|---|---|---|
| 0000 → 0000 | | 1000 → 0000 | 1100 → 0000 |
| 0000 → 0001 | | 1000 → 0001 | 1100 → 0001 |
| 0000 → 0010 | | 1000 → 0010 | 1100 → 0010 |
| 0000 → 0011 | | 1000 → 0011 | 1100 → 0011 |
| 0001 → 0100 | | 1001 → 0100 | 1101 → 0100 |
| 0001 → 0110 | 0101 → 0110 | 1001 → 0110 | 1101 → 0110 |
| 0001 → 0111 | 0101 → 0111 | 1001 → 0111 | 1101 → 0111 |
| 0010 → 1000 | 0110 → 1000 | 1010 → 1000 | 1110 → 1000 |
| 0010 → 1001 | 0110 → 1001 | 1010 → 1001 | 1110 → 1001 |
| 0010 → 1011 | 0110 → 1011 | | 1110 → 1011 |
| 0011 → 1100 | 0111 → 1100 | | 1111 → 1100 |
| 0011 → 1101 | 0111 → 1101 | | 1111 → 1101 |
| 0011 → 1110 | 0111 → 1110 | | 1111 → 1110 |
| 0011 → 1111 | 0111 → 1111 | | 1111 → 1111 |

(total 2 bit transitions = 42)

TABLE 17

Transition Collection F

| | | | |
|---|---|---|---|
| 0000 → 0000 | 0100 → 0000 | 1000 → 0000 | 1100 → 0000 |
| 0000 → 0001 | 0100 → 0001 | 1000 → 0001 | 1100 → 0001 |
| 0000 → 0011 | 0100 → 0011 | 1000 → 0011 | 1100 → 0011 |
| 0001 → 0100 | | 1001 → 0100 | 1101 → 0100 |
| 0001 → 0110 | 0101 → 0110 | 1001 → 0110 | 1101 → 0110 |
| 0001 → 0111 | | 1001 → 0111 | 1101 → 0111 |
| 0010 → 1000 | 0110 → 1000 | | 1110 → 1000 |
| 0010 → 1001 | 0110 → 1001 | 1010 → 1001 | 1110 → 1001 |
| 0010 → 1011 | 0110 → 1011 | | 1110 → 1011 |
| 0011 → 1100 | 0111 → 1100 | 1011 → 1100 | 1111 → 1100 |
| 0011 → 1110 | 0111 → 1110 | 1011 → 1110 | 1111 → 1110 |
| 0011 → 1111 | 0111 → 1111 | 1011 → 1111 | 1111 → 1111 |

(total 2 bit transitions = 44)

In summary, an encoder 132, 202 is provided that is capable of encoding data words, S, into code words comprising first symbols (1's) and second symbols (0's) such that in a concatenated string of code words, u, sub-strings of consecutive first symbols (1's) have no more symbols than a maximum number; sub-strings of consecutive first symbols (1's) having the maximum number of first symbols that begin at selected locations within the string of code words appear without restriction and sub-strings of consecutive first symbols having the maximum number of first symbols that being at locations other than the selected locations appear only where the sub-string is concatenated with an acceptable secondary substring of first and second symbols (10,01).

In some embodiments, the encoder is part of an apparatus 130, 200 that further includes a storage system 138, 208 for storing representations of the code words on a storage medium 160. The apparatus also includes a detector 148, 220 that is capable of converting sample values retrieved from the storage medium into a most likely sequence of detected data. The apparatus further includes a decoder 154, 226 for converting the detected data into recovered data by performing the inverse function of the encoder.

A method of generating a set of code words for an encoder 132, 202 is also provided that eliminates code words that have strings of consecutive first symbols that are longer than a maximum length. The method retains some code words that have a string of consecutive first symbols that is as long as the maximum length, if the string begins in a selected location (even-bit, odd-bit). The method also retains some code words that have a string of consecutive first symbols that is as long as the maximum length if the string begins in a location other than a selected location and the string is concatenated with an acceptable sub-string (10, 01). Code words are eliminated that have a string of consecutive first symbols that is as long as the maximum length if the string begins in a location other than a selected location and the string is not concatenated with an acceptable sub-string.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the encoder while maintaining substantially the same functionality without departing from the scope and spirit of the present invention. In addition, although the preferred embodiment described herein is directed to an encoder for a disc-drive system, it will be appreciated by those skilled in the art that the teachings of the present invention can be applied to other systems, like tape-drive, internet or intranet systems, without departing from the scope and spirit of the present invention.

Further information supporting the above statements and allowing practitioners to adapt the present invention for a particular application, although not required for the practice of the present invention, is provided in the following references.

1. J. Moon et al. "Maximum transition run codes for data storage systems," IEEE Trans. Mag., Vol. 32, No. 5, pp. 3992–3994, September 1996.
2. W. Bliss, "An 8/9 rate time-varying trellis code for high density recording," InterMag 97.
3. P. Siegel et al. "An 8/9 rate trellis code for $E^2PR4$," presented UCSD CMRR, May 1997.
4. R. Karabed et al. "Analysis of error sequences for PRML and EPRML Signaling performed over Lorentzian channel," pp. 368–373, Globecom 96.
5. Z. Kern et al. "Experimental Performance Comparison of FTDS/DFE Detectors: 8/9 (O,k) vs. 4/5 MTR Codes," InterMag 97.
6. S. Altekar et al. "Distance Spectra for PRML Channels," InteMag 97.
7. L. Fredrickson, et al. "Time Varying Viterbi Detectors for Control of Error Event Length," U.S. Pat. No. 5,280,489, Jan. 18, 1994.
8. L. Fredrickson, et al. "Time Varying Modulo N Trellis Codes for Input Restricted Partial Response Channels, "U.S. Pat. No. 5,257,272, October 1993.

Appendix A. VHDL source code for one embodiment of an 8/9 encoder
Dual 89 Encoder
Author: Lisa Fredrickson
(c) Seagate Technology Aug. 25, 1997
Version: 2.0
Last Modified: Aug. 26, 1997
Test Bench: Anuradha Sukhija library IEEE;
use IEE.STD_LOGIC_1164.all

```
entity MTR2_ENCODER is
port    (U    : in std_logic_vector (7 downto 0);
         P    : in std_logic;
         D    : out std_logic_vector (8 downto 0);
end MTR2_ENCODER;
architecture CLOGIC of MTR2_ENCODER is
signal o765            : std_logic;
signal n765            : std_logic;
signal o5432           : std_logic;
signal o76n54          : std_logic;
signal n7621           : std_logic;
signal o71n6           : std_logic;
signal o654            : std_logic;
signal o543            : std_logic;
signal o432            : std_logic;
signal n732            : std_logic;
signal o321            : std_logic;
signal o210            : std_logic;
signal o540            : std_logic;
signal o76             : std_logic;
signal o60             : std_logic;
signal o54             : std_logic;
signal o21             : std_logic;
signal o10             : std_logic;
signal n76             : std_logic;
signal n54             : std_logic;
signal n51             : std_logic;
signal n43             : std_logic;
signal n32             : std_logic;
signal n10             : std_logic;
signal p1              : std_logic;
signal p2              : std_logic;
signal p3              : std_logic;
signal p4              : std_logic;
signal p5              : std_logic;
signal p6              : std_logic;
signal p7              : std_logic;
signal p8              : std_logic;
signal p9              : std_logic;
signal p10             : std_logic;
signal p11             : std_logic;
signal p12             : std_logic;
signal p13             : std_logic;
signal p14             : std_logic;
signal p15             : std_logic;
signal p16             : std_logic;
signal w1              : std_logic_vector (8 downto 0);
signal w2              : std_logic_vector (8 downto 0);
signal w3              : std_logic_vector (8 downto 0);
signal w4              : std_logic_vector (8 downto 0);
signal w5              : std_logic_vector (8 downto 0);
signal w6              : std_logic_vector (8 downto 0);
signal w7              : std_logic_vector (8 downto 0);
signal w8              : std_logic_vector (8 downto 0);
signal w9              : std_logic_vector (8 downto 0);
signal w10             : std_logic_vector (8 downto 0);
signal w11             : std_logic_vector (8 downto 0);
signal w12             : std_logic_vector (8 downto 0);
signal w13             : std_logic_vector (8 downto 0);
signal w14             : std_logic_vector (8 downto 0);
signal w15             : std_logic_vector (8 downto 0);
signal w16             : std_logic_vector (8 downto 0);

begin
o765  <=U(7) and U(6) and U(5);
is o654  <=U(6) and U(5) and U(4);
o543  <=U(5) and U(4) and U(3);
o432  <=U(4) and U(3) and U(2);
o321  <=U(3) and U(2) and U(1);
o210  <=U(2) and U(1) and U(0);
o540  <=U(5) and U(4) and U(0);
n765  <=not(U(7) or U(6) or U(5));
n732  <=not(U(7) or U(3) or U(2));
n7621 <=not(U(7) or U(6) or U(2) or U(1));
o71n6 <=U(7) and U(1) and not U(6);
o5432 <=U(5) and U(4) and U(3) and U(2);
``` o76 <=U(7) and U(6);
o54 <=U(5) and U(4);
o21 <=U(2) and U(1);
o10 <=U(1) and U(0);
o60 <=U(6) and U(0);
n76 <=U(7) nor U(6);
n43 <=U(4) nor U(3);
n54 <=U(5) nor U(4);
n51 <=U(5) nor U(1);
n32 <=U(3) nor U(2);
n10 <=U(1) nor U(0);
o76n54 <=o76 and n54;
p1<=o765 and not (o321 or (o210 and n43) or (o432 and n10));
p2 <=o321 and not (o765 or (o654 and not (U(7))) or (o540 and n76) or o76n54);
p3 <=o543 and not (n7621 or o21 or o76 or o71n6);
p4 <=o654 and o321;
p5 <=o5432 and ((o76 and n10) or (n76 and o10));
p6 <=o321 and U(0) and o76 and not (U(4));
p7 <=not (U(7) or U(6) or U(5) or U(4) or U(3) or U(2));
p8 <=not (U(4) or U(3) or U(2) or U(12) or U(0)) and not (o765 or n765);
p9 <=o765 and o21 and (U(0) xor U(3)) and not (U(4));
p10 <=n76 and o54 and n32 and o10;
p12 <=n43 and o210 and not o765;
p13 <=o654 and n732;
p14 <=o432 and n51 and not o60;
p15 <=o543 and n7621;
p16 <=o321 and o76 and n54 and not U(0);
p11<=not(p1or p2 or p3 or p4 or p5 or p6 or p7 or p8 or p9 or p10 or p12 or p13 or p14 or p15 or p16);
w1<=(p1 & p1 & p1 & p1 & p1 & p1 & p1 & p1 & p1) and ("10" & U(4) & U(3) & U(2) & U(1) & U(0) & "01");
w2 <=(p2& p2& p2& p2& p2& p2& p2& p2& p2)and ("01" & U(7) & U(6) & U(5) & U(4) & U(0) & "01");
w3 <=(p3& p3& p3& p3& p3& p3& p3& p3& p3) and ("00" & U(7) & U(6) & U(2) & U(1) & U(0) & "01");
w4 <=(p4& p4& p4& p4& p4& p4& p4& p4& p4)and ("00110" & U(7) & U(0) & "01");
w5 <=(p5& p5& p5& p5& p5& p5& p5& p5& p5)and ("001001" & U(0) & "01");
w6 <=(p6& p6& p6& p6& p6& p6& p6& p6& p6)and ("001011" & U(5) & "01");
w7 <=(p7 & p7 & p7 & p7 & p7 & p7 & p7 & p7 & p7) and ("11000" & U(1) & U(0) & "01");
w8 <=(p8& p8& p8& p8& p8& p8& p8& p8& p8)and ("1101" & (U(7) and not U(6)) & (U(6) and not U(7)) & U(5) & "01");
w9 <=(p9& p9& p9& p9& p9& p9& p9& p9& p9)and ("110010" & U(0) & "01");
w10<=(p10 & p10 & p10 & p10 & p10 & p10 & p10 & p10 & p10) and ("000011001");
w11<=(p11 & p11 & p11 & p11 & p11 & p11 & p11 & p11 & p11) and (U(7) & U(6) & U(5) & U(4) & U(3) & U(2) & U(1) & U(0) & "0");
w12 <=(p12& p12& p12& p12& p12& p12& p12& p12& p12)and (U(7) & U(6) & U(5) & (P and not U(5)) & not (P and U(5)) & "1" & (U(5) or (not P)) & (P and U(5)) & "0");
w13<=(p13 & p13 & p13 & p13 & p13 & p13 & p13 & p13 & p13) and (U(1) & U(0) & "0" & P & "11" & (not P) & "01");
w14<=(p14 & p14 & p14 & p14 & p14 & p14 & p14 & p14 & p14) and ("0" & P & "11" & (not p) & "0" & U(7) & U(6) & U(0));
w15<=(p15& p15& p15& p15& p15& p15& p15& p15& p15)and ("1" & (P and U(0)) & (not P) & (not P) & (not P) & P & P & P & (U(0) and (not P));
w16<=(p16 & p16 & p16 & p16 & p16 & p16 & p16 & p16 & p16) and ("10 & (not P) & "11" & P & "010");
D <=w1 or w2 or w3 or w4 or w5 or w6 or w7 or w8 or w9 or w10 or w11 or w12 or w13 or w14 or w15 or w16; end CLOGIC Appendix A. VHDL source code for one embodiment of an 8/9 decoder
Dual 8/9 Decoder
Author: Lisa Fredrickson
(c) Seagate Technology Aug. 25, 1997
Version: 2.0
Last Modified: Aug. 26,1997
Test Bench: Anuradha Sukhija library IEEE; use IEE.STD$_{13}$ LOGIC__1164.all

```
entity MTR2_DECODER is
port   (D          : in std_logic_vector (8 downto 0);
        U          : out std_logic_vector (7 downto 0);
        ERASE      : out std_logic;
       end MTR2_DECODER;
       architecture CLOGIC of MTR2_DECODER is
        signal p1      : std_logic;
        signal p2      : std_logic;
        signal p3      : std_logic;
        signal p4      : std_logic;
        signal p5      : std_logic;
        signal p6      : std_logic;
        signal p7      : std_logic;
        signal p8      : std_logic;
        signal p9      : std_logic;
        signal p10     : std_logic;
        signal p11     : std_logic;
        signal p12     : std_logic;
        signal p13     : std_logic;
        signal p14     : std_logic;
        signal p15     : std_logic;
        signal p16     : std_logic;
        signal p17     : std_logic;
        signal d2      : std_logic;
        signal d13     : std_logic;
        Signal d14     : std_logic;
        signal d15     : std_logic;
        signal d16     : std_logic;
        signal p18     : std_logic;
        signal p19     : std_logic;
        signal p20     : std_logic;
        signal p21     : std_logic;
        signal n432    : std_logic;
        signal w1      : std_logic_vector (7 downto 0);
        signal w2      : std_logic_vector (7 downto 0);
        signal w3      : std_logic_vector (7 downto 0);
        signal w4      : std_logic_vector (7 downto 0);
        signal w5      : std_logic_vector (7 downto 0);
        signal w6      : std_logic_vector (7 downto 0);
        signal w7      : std_logic_vector (7 downto 0);
        signal w8      : std_logic_vector (7 downto 0);
        signal w9      : std_logic_vector (7 downto 0);
        signal w10     : std_logic_vector (7 downto 0);
        signal w11     : std_logic_vector (7 downto 0);
        signal w12     : std_logic_vector (7 downto 0);
        signal w13     : std_logic_vector (7 downto 0);
        signal w14     : std_logic_vector (7 downto 0);
        signal w15     : std_logic_vector (7 downto 0);
        signal w16     : std_logic_vector (7 downto 0);
        signal dualflag : std_logic;
        signal myerase  : std_logic;

begin
n432 <=not (D(4) or D(3) or D(2));
p21 <='1' when (D="100111010") else '0';
p16 <='1' when (D="101110010") else '0';
p20 <='1' when (D and "101111111")="100001110" else '0';
p15 <='1' when (D and "111111110") ="101110000" else '0';
``` p19 <='1' when ((D and "111111000")="011100000") and ((D and "000000011"/="000000011") else '0';
p14 <='1' when ((D and "111111000")="001110000") and ((D and "000000011"/="000000011") else '0';
p18 <='1' when (D and "001111111")="000111001" else '0';
p13 <='1' when (D and "001111111")="000011101" else '0';
p17 <='1' when ((D and "001111111")="000111000" or (((D and "001111111")="001001110") and ((D and "110000000") /="110000000")) else '0';
p12 <='1' when ((D and "0001111111")="000011100") and ((D and "111000000")/="111000000") else '0';
d12 <=p12 or p17;
d13 <=p13 or p18;
d14 <=p14 or p19;
d15 <=p15 or p20;
d16 <=p16 or p21;
    dualflag <=p12 or p13 or p14 or p15 or p16 or p17 or p18 or p19 or p20 or p21;
    myerase <='1' when ((D ="000001110") or
(D ="000111010") or
(D ="001100110") or
(D ="010001110") or
(D ="110011001") or
((D and "000111111")="000000000")or
((D and "111111000")="000000000")) else '0';
p11<=not (myerase or dualflag or D(0));
p1<=not (p13 or p15 or p18) and '1' when ((D and "110000011")="010000001") else '0';
p1 <=not (p13 or p18 or p19) and '1' when ((D and "110000011")="010000001") else '0';
p4 <='1' when ((D and "111110011")="001100001") else '0';
p5 <='1' when ((D and "111111011")="001001001") else '0';
p6 <='1' when ((D and "111111011")="001011001") else '0';
p7 <='1' when ((D and "111110011")="110000001") else '0';
p8 <='1' when (((D and "111110011")="110100001") or ((D and "111111011")="110110001") else '0';
p9 <='1' when ((D and "111111011")="110010001") else '0';
p10 <='1' when (D="000011001") else '0';
p3 <=not (myerase or p18 or p14 or p13 or p10 or p6 or p5 or p4) and '1' when ((D and "110000011")= "000000001") else '0';
w1 <=(p1 & p1 & p1 & p1 & p1 & p1 & p1 & p1) and ("111" & D(6) & D(5) & D(4) & D(3) & D(2));
w2 <=(p2& p2& p2& p2& p2& p2& p2& p2)and (D(6) & D(5) & D(4) & D(3) & "111" & D(2));
w3 <=(p3& p3& p3& p3& p3& p3& p3& p3)and (D(6) & D(5) & "111" & D(4) & D(3) & D(2));
w4 <=(p4& p4& p4& p4& p4& p4& p4& p4) and (D(3) & "111111" & D(2));
w5 <=(p5 & p5 & p5 & p5 & p5 & p5 & p5 & p5)and ((not D(2)) & (not D(2)) & "1111" & D(2) & D(2));
w6 <=(p6 & p6 & p6 & p6 & p6 & p6 & p6 & p6)and ("11" & D(2) & "01111");
w7 <=(p7 & p7 & p7 & p7 & p7 & p7 & p7 & p7)and ("000000" & D(3) & D(2));
w8 <=(p8 & p8 & p8 & p8 & p8 & p8 & p8 & p8)and ((n432 or D(4)) & (n432 or D(3)) & D(2) & "00000");
w9 <=(p9 & p9 & p9 & p9 & p9 & p9 & p9 & p9)and ("1110" & (not D(2)) & "11" & D(2));
w10 <=(p10 & p10 & p10 & p10 & p10 & p10 & p10 & p10)and ("00110011");
w11<=(p11 & p11 & p11 & p11 & p11 & p11 & p11 & p11) and (D(8) & D(7) & D(6) & D(5) & D(4) & D(3) & D(2) & D(1));
w12 <=(d12 & d12 & d12 & d12 & d12 & d12 & d12 & d12)and (D(8) & D(7) & D(6) & "00111");
w13 <=(d13 & d13 & d13 & d13 & d13 & d13 & d13 & d13)and ("011100" & D(8) & D(7));
w14 <=(d14 & d14 & d14 & d14 & d14 & d14 & d14 & d14) and (D(2) & D(1) & "01110" & D(0));
w15 <=(d15 & d15 & d15 & d15 & d15 & d15 & d15 & d15)and ("0011100" & (D(7) or D(0)));
w16 <=(d16 & d16 & d16 & d16 & d16 & d16 & d16 & d16)and ("11001110");
U <=w1 or w2 or w3 or w4 or w5 or w6 or w7 or w8 or w9 or w10 or w11 or w12 or w13 or w14 or w15 or w16;
Erase <=myerase; end clogic

What is claimed is:

1. An encoder for converting data words into code words comprising first symbols and second symbols such that a concatenated string of code words has constraints as follows:
   a) sub-strings of consecutive first symbols have no more symbols than a maximum number;
   b) sub-strings of consecutive first symbols having the maximum number of first symbols that begin at selected locations within the string of code words appear without restriction; and
   c) sub-strings of consecutive first symbols having the maximum number of first symbols that begin at locations other than the selected locations appear only where the sub-string is concatenated with an acceptable secondary sub-string of first and second symbols.

2. The encoder of claim 1 wherein the acceptable secondary sub-string comprises a second symbol concatenated to the sub-string of consecutive first symbols and a first symbol concatenated to the second symbol.

3. The encoder of claim 2 wherein the second symbol of the secondary sub-string is concatenated to the beginning of the sub-string of consecutive first symbols.

4. The encoder of claim 3 wherein the second symbol of the secondary sub-string is concatenated to the end of the sub-string of consecutive symbols.

5. The encoder of claim 1 wherein the maximum number is three.

6. The encoder of claim 1 wherein each data word contains a data number of data symbols and each code word contains a code number of code symbols, the data number and code number being associated as pair numbers denoted generically as data number: code number and selected from a set of paired numbers including 7:8, 8:9, and 9:10.

7. The encoder of claim 1 wherein the encoder forms part of an apparatus further comprising:
   a storage system coupled to the encoder and capable of storing a representation of the code words on a storage medium and of retrieving sample values from the storage medium;
   a detector, coupled to the storage system and capable of converting the sample values into detected data by determining a most likely sequence of detected data based on the sampled values, and
   a decoder capable of converting a representation of the detected data into recovered data by performing the inverse function of the encoder.

8. The encoder and apparatus of claim 7 wherein the detector is a radix four detector that operates in a time-varying but periodic manner such that available transitions from a detector state do not depend on past decisions made by the detector.

9. The encoder and apparatus of claim 8 wherein the encoder generates code words using a first set and a second set of code words, the selected locations within the code words of the first set of code words being different from the selected locations within the code words of the second set of code words.

10. The encoder and apparatus of claim 9 wherein the encoder alternates between generating code words from the first set of code words and generating code words from the second set of code words such that two consecutive code words are from different sets of code words.

11. The encoder and apparatus of claim 10 wherein the first set of code words and the second set of code words have some code words in common.

12. The encoder and apparatus of claim 10 wherein the code words have an odd number of symbols.

13. The encoder of claim 1 wherein the encoder forms part of a disk drive.

14. A method of generating a set of code words for an encoder, the method comprising steps of:
(a) eliminating code words that have strings of consecutive first symbols that are longer than a maximum length;
(b) retaining some code words that have a string of consecutive first symbols that is as long as the maximum length if the string begins in a selected location;
(c) retaining some code words that have a string of consecutive first symbols that is as long as the maximum length if the string begins in a location other than a selected location and the string is concatenated with an acceptable sub-string; and
(d) eliminating code words that have a string of consecutive first symbols that is as long as the maximum length if the string begins in a location other than a selected location and the string is not concatenated with an acceptable sub-string.

15. The method of claim 14 wherein the maximum length is three.

16. The method of claim 15 wherein code words comprise eight code symbols of the form $\{u_7u_6u_5u_4u_3u_2u_1u_0\}$ and wherein step (c) comprises retaining code words where $u_7u_6u_5u_4u_3=10111$ and step (d) comprises eliminating code words where $u_7u_6u_5u_4u_3=00111$.

17. The method of claim 16 further comprising:
(e) identifying two code words that differ from each other in the placement of a string of consecutive first symbols that is as long as the maximum length; and
(f) designating the two code words as encoding the same data word.

18. The method of claim 15 wherein the code words comprise nine code symbols of the form $\{u_8u_7u_6u_5u_4u_3u_2u_1u_0\}$, the method comprising a further step of (e) eliminating code words where:
(i) $u_8u_7u_6u_5u_4u_3=000000$ or (ii) $u_5u_4u_3u_2u_1u_0=000000$.

19. The method of claim 15 wherein the code words comprise-nine code symbols of the form $\{u_8u_7u_6u_5u_4u_3u_2u_1u_0\}$ and wherein step (d) comprises separately eliminating code words for two different sets of possible code words by:
(1) for one set of code words eliminating code words where:
(A) $u_7u_6u_5u_3=1110$ or
(B) $u_7u_5u_4u_3=0111$ or
(C) $u_5u_4u_3u_1=1110$ or
(D) $u_5u_3u_2u_1=0111$; and
(2) for the other set of code words eliminating code words where:
(A) $u_8u_6u_5u_4=1110$ or
(B) $u_6u_5u_4u_2=0111$ or
(C) $u_6u_4u_3u_2=1110$ or
(D) $u_4u_3u_2u_0=0111$.

20. The method of claim 15 wherein code words comprise ten code symbols of the form $\{u_9u_8u_7u_6u_5u_4u_3u_2u_1u_0\}$ and step (d) comprises eliminating code words where:
(i) $u_8u_7u_6u_4=1110$ or
(ii) $u_8u_6u_5u_4=0111$ or
(iii) $u_6u_5u_4u_2=1110$ or
(iv) $u_6u_4u_3u_2=0111$ or
(v) $u_4u_3u_2u_0=1110$.

21. A data storage system for storing data, the system comprising:
a storage medium capable of storing data for a period of time; and encoder means for encoding user data into code word data to be stored on the storage mediums.

* * * * *

UNITED STATES PATENT AND TRADEMARK OFFICE
CERTIFICATE OF CORRECTION

PATENT NO. : 6,400,288 B1  Page 1 of 3
DATED : June 4, 2002
INVENTOR(S) : Fredrickson et al.

It is certified that error appears in the above-identified patent and that said Letters Patent is hereby corrected as shown below:

Column 4,
Equation 2 should read: $P(D) = (1-D)(1+D)^k$

Equation 4 should read: $y_i = x_i + x_{i-1} - x_{i-2} - x_{i-3}$

Column 6,
Lines 18-22 replace (i), (ii), & (iii) with the following:

$e_{x,k_1-k} = 0$ for all $0 < k \leq \text{degree}[p(D)]$      (i)

$e_{x,k_1} \neq 0$, and      (ii)

$k_2$ is the smallest value of $k \geq k_1$ for which $e_{x,k-j} = 0$ for all      (iii)

Column 7,
Line 51, after "where" replace " G = B⊕C, HD= D⊕E " with -- G = B ⊕ C, H = D ⊕ E --.

Column 8,
Replace Table 1 with the following:

| Table 1 | | |
|---|---|---|
| Allowed Tribit NRZ (NRZI) | $P, P, \overline{P}, P, \overline{P}, \overline{P}$ (0,1,1,1,0) | $P, P, \overline{P}, P, \overline{P}, \overline{P}$ (0,1,1,1,0) |
| Restrited Tribit NRZ (NRZI) | $P, \overline{P}, \overline{P}, P, \overline{P}, P$ (1,0,1,1,1) | $P, P, P, \overline{P}, P, \overline{P}$ (0,0,1,1,1) |
| NRZ Difference Sequence | 0, +1, 0, 0, 0, -1 | 0, 0, -1, +1, -1, 0 |
| EPR4 Output Difference Sequence | 0, +1, +1, -1, -1, -1, -1, +1, +1 | 0, 0, -1, 0, +1, +1, 0, +1, 0 |
| E²PR4 Output Difference Sequence | 0, +1, +2, 0, -2, -2, -2, 0, +2, +1 | 0, 0, -1, -1, +1, 0, -1, +1, +1, 0 |

Column 10,
Line 27, replace " $s_u^{(1)} : B \oplus \overline{\overline{CC}} 11C0C11\overline{CC} \oplus G$ " with -- $s_u^{(1)} : B \oplus C\overline{C} 11C0C11\overline{CC} \oplus G$ --

Column 11,
Line 6, Table 3-continued, replace this line with the following:
  11001000 11001001 11001010 11001100 11001101 11010000 11010001 11010010

UNITED STATES PATENT AND TRADEMARK OFFICE
CERTIFICATE OF CORRECTION

PATENT NO. : 6,400,288 B1
DATED : June 4, 2002
INVENTOR(S) : Fredrickson et al.

It is certified that error appears in the above-identified patent and that said Letters Patent is hereby corrected as shown below:

<u>Column 12,</u>
Line 31, replace "$(i)u_1u_0 = 11$" with -- $u_1u_0 = 11$ (i) --.

<u>Column 14,</u>
Line 10, replace "$u5u_3u_2u_1 = 0111$ (xv)" with
-- $u_5u_3u_2u_1 = 0111$ (xv)" --.

<u>Column 22,</u>
Line 11, replace
"...$x_6x_5x_4x_3x_4x_3x_2x_1x_2x_1x_0x_7'x_0x_7x_6'x_5'$... "with -- ... $\Rightarrow x_6x_5x_4x_3 \Rightarrow x_4x_3x_2x_1 \Rightarrow x_2x_1x_0x_7' \Rightarrow x_0x_7x_6'x_5' \Rightarrow$ ... --.

<u>Column 23,</u>
Line 19, replace
"...$x_7x_6x_5x_4x_5x_4x_3x_2x_3x_2x_1x_0x_1x_0x_7'x_6'$..." with -- ... $\Rightarrow x_7x_6x_5x_4 \Rightarrow x_5x_4x_3x_2 \Rightarrow x_3x_2x_1x_0 \Rightarrow x_1x_0x_7'x_6' \Rightarrow$ ... --.

Lines 53-54, replace
"...$x_8x_7x_6x_5x_6x_5x_4x_3x_4x_3x_2x_1x_2x_1x_0x_8'x_0x_8'x_7'x_6'$...
...$x_7'x_6'x_5'x_4'x_5'x_4'x_3'x_2'x_3'x_2'x_1'x_0'x_1'x_0'x_8''x_7''$..."
with -- ...$\Rightarrow x_8x_7x_6x_5 \Rightarrow x_6x_5x_4x_3 \Rightarrow x_4x_3x_2x_1 \Rightarrow x_2x_1x_0x_8' \Rightarrow x_0x_8'x_7'x_6' \Rightarrow$...
... $\Rightarrow x_7'x_6'x_5'x_4' \Rightarrow x_5'x_4'x_3'x_2' \Rightarrow x_3'x_2'x_1'x_0' \Rightarrow x_1'x_0'x_8''x_7'' \Rightarrow$ ... --.

<u>Column 24,</u>
Line 20, replace " $x_3'x_2'x_1'x_0'x_1'x_0'x_8''x_7''$ " with
-- $x_3'x_2'x_1'x_0' \Rightarrow x_1'x_0'x_8''x_7''$ --.

<u>Column 27,</u>
Line 61, after "Dual" replace "89" with -- 8/9 --.

UNITED STATES PATENT AND TRADEMARK OFFICE
CERTIFICATE OF CORRECTION

PATENT NO. : 6,400,288 B1
DATED : June 4, 2002
INVENTOR(S) : Fredrickson et al.

It is certified that error appears in the above-identified patent and that said Letters Patent is hereby corrected as shown below:

Column 29,
Line 21, after "or" third occurrence replace "U(12)" with -- U(1) --.

Signed and Sealed this

Seventh Day of January, 2003

JAMES E. ROGAN
*Director of the United States Patent and Trademark Office*